(12) United States Patent
Gilbert et al.

(10) Patent No.: US 8,305,232 B2
(45) Date of Patent: Nov. 6, 2012

(54) UTILITY NETWORK INTERFACE DEVICE CONFIGURED TO DETECT AND REPORT ABNORMAL OPERATING CONDITION

(75) Inventors: Brad Gilbert, Burlingame, CA (US); Raj Vaswani, Portola Valley, CA (US); Jana van Greunen, Redwood City, CA (US)

(73) Assignee: Silver Spring Networks, Inc., Redwood City, CA (US)

( * ) Notice: Subject to any disclaimer, the term of this patent is extended or adjusted under 35 U.S.C. 154(b) by 414 days.

(21) Appl. No.: 12/622,306

(22) Filed: Nov. 19, 2009

(65) Prior Publication Data

US 2011/0115642 A1    May 19, 2011

(51) Int. Cl.
*G08C 15/06* (2006.01)
(52) U.S. Cl. .................... 340/870.02; 709/223; 709/224; 324/260; 370/359; 370/397; 370/401; 307/39; 340/870.09; 340/635; 340/568.1
(58) Field of Classification Search ............. 340/870.02, 340/870.09, 635, 568.1, 815.45; 709/224, 709/223; 324/260; 370/401, 397, 395; 307/39
See application file for complete search history.

(56) References Cited

U.S. PATENT DOCUMENTS

| | | | |
|---|---|---|---|
| 5,574,653 | A | 11/1996 | Coomer et al. |
| 5,805,458 | A | 9/1998 | McNamara et al. |
| 5,818,725 | A | 10/1998 | McNamara et al. |
| 5,940,009 | A | 8/1999 | Loy et al. |
| 6,100,816 | A | 8/2000 | Moore |
| 6,538,577 | B1 | 3/2003 | Ehrke et al. |
| 7,889,094 | B2 * | 2/2011 | Gilbert et al. ............ 340/815.45 |
| 7,920,983 | B1 | 4/2011 | Peleg et al. |
| 2007/0222637 | A1 * | 9/2007 | Davidow .................. 340/870.02 |
| 2007/0257813 | A1 | 11/2007 | Vaswani et al. |
| 2008/0294452 | A1 | 11/2008 | Hunt |
| 2009/0079584 | A1 | 3/2009 | Grady et al. |

(Continued)

FOREIGN PATENT DOCUMENTS

EP    0 629 098 B1    12/2001
(Continued)

OTHER PUBLICATIONS

Invitation to Pay Additional Fees and Partial Search Report, dated Aug. 23. 2011.

(Continued)

*Primary Examiner* — Lam T Mai
(74) *Attorney, Agent, or Firm* — Buchanan Ingersoll & Rooney PC

(57) ABSTRACT

A utility network interface device is provided for operation with a utility network. The utility network interface device includes a detector configured to produce a state signal upon occurrence of a prescribed state that interferes with the ability of a utility meter, with which the utility network interface device is associated, to measure consumption of a commodity and/or report consumption of the commodity. The utility network interface device also includes a control unit configured to detect a tampering with the utility meter in accordance with the state signal produced by the detector. The control unit automatically controls a notification unit to output, external to the utility meter, notification of the tampering detected by the control unit, in response to the detection of the tampering. Also provided are a utility network including the utility network interface device, a method of operating a utility network interface device, and a computer-readable recording medium having a computer program recorded thereon for operating a utility network interface device.

43 Claims, 7 Drawing Sheets

U.S. PATENT DOCUMENTS

| | | |
|---|---|---|
| 2009/0153356 A1 | 6/2009 | Holt |
| 2009/0212971 A1 | 8/2009 | Casey et al. |
| 2009/0309749 A1* | 12/2009 | Gilbert et al. ............ 340/815.45 |
| 2010/0102987 A1* | 4/2010 | Lou et al. ................. 340/870.02 |
| 2011/0215945 A1 | 9/2011 | Peleg et al. |
| 2011/0288777 A1 | 11/2011 | Gupta |

FOREIGN PATENT DOCUMENTS

| | | |
|---|---|---|
| WO | 95/24623 A1 | 9/1995 |
| WO | 03/065055 A2 | 8/2003 |

OTHER PUBLICATIONS

International Search Report & Written Opinion, dated Nov. 11, 2011, for PCT/US2010/003003.

Office Action issued Aug. 31, 2012 in related U.S. Appl. No. 12/851,830.

Office Action issued Apr. 27, 2012 in co-pending U.S. Appl. No. 12/622,359.

* cited by examiner

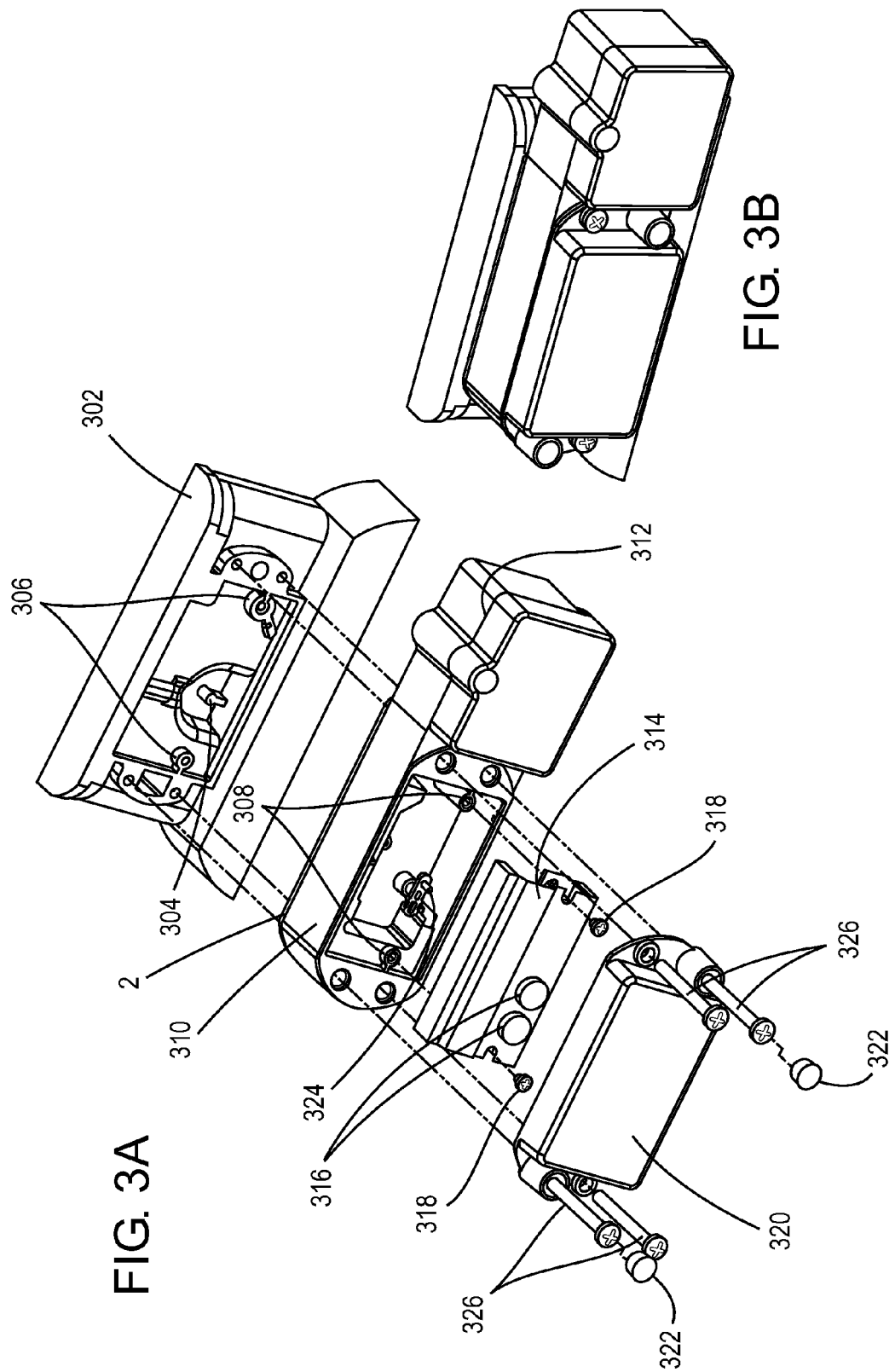

UTILITY NETWORK INTERFACE DEVICE CONFIGURED TO DETECT AND REPORT ABNORMAL OPERATING CONDITION

FIELD OF THE DISCLOSURE

The present disclosure relates generally to a utility network interface device operating in connection with a utility meter and configured to detect an abnormal operating condition, such as if the utility network interface device has been tampered with, and to report the abnormal operating condition for appropriate notification thereof.

BACKGROUND

Automated Meter Reading (AMR) systems, including handheld, mobile and network technologies for automatically collecting data from utility meters, efficiently and accurately collect metering data, as compared to manual meter reading. Advanced Metering Infrastructure (AMI) networks employing AMR technology collect additional types of data, such as interval data or logging of meter events. The additional data is used for a variety of purposes, e.g., usage profiling, time of use billing, demand forecasting, demand response, rate of flow recording, leak detection, flow monitoring, conservation enforcement, and remote shutoff.

In an AMR/AMI network, the utility meters are fully electronic with data reading, data storing, and digital packet communications capabilities. The utility meters are all linked together in a wireless LAN (local area network) configuration. In this configuration, each utility meter is a network node. Each node can communicate with other nodes directly and with a communication station of the utility provider via access points. Some nodes may be able to communicate with more than one access point. The access points act as a gateway for the nodes in the wireless network, and transfer messages between themselves, other nodes and the communication station of the utility provider. Similarly, the communication station of the utility provider can communicate with the nodes in the wireless LAN via the access points. Access points can be passive bridges or active data routers/forwarders, depending on the type of network devices deployed and the applications. An example of an AMR/AMI network and a technique of connecting nodes thereto is found in co-pending U.S. application Ser. No. 11/732,964, which is incorporated herein by reference in its entirety.

While the introduction of an AMR/AMI network has facilitated communications between utility meters and a communication station of a utility provider, tampering with the nodes in the network has become an attendant problem. For example, utility consumers may tamper with the utility meter in an attempt to interfere with the meter's function of measuring usage of a commodity, such as gas, electricity or water. In addition, utility consumers may tamper with the utility meter by attempting to interfere with the meter's ability to communicate with other nodes in the network, including a communication station of the utility provider, an access point in the network, a relay station in the network, and/or other meters in the network, and thereby thwart the ability of the tampered meter to accurately report usage of the commodity.

SUMMARY

An exemplary embodiment of the present disclosure provides a utility network interface device. The exemplary utility network interface device comprises a detector configured to produce a state signal upon occurrence of a prescribed state that interferes with the ability of a utility meter, with which the utility network interface device is associated, to at least one of measure consumption of a commodity and report consumption of the commodity. In addition, the exemplary utility network interface device comprises a control unit configured to detect a tampering with the utility meter in accordance with the state signal produced by the detector. The exemplary utility network interface device also comprises a notification unit configured to output, external to the utility meter, notification of the tampering detected by the control unit. The control unit is configured to automatically control the notification unit to output the external notification of the tampering in response to the detection of the tampering.

An exemplary embodiment of the present disclosure provides a utility network interface device. The exemplary utility network interface device comprises a detector configured to produce a detection signal upon each detection of consumption of a unit of a commodity in a utility meter with which the utility network interface device is associated. The exemplary utility network interface device also comprises a control unit configured to detect a tampering with the utility meter when a number of detection signals produced by the detector over a predetermined period of time is below a threshold value. In addition, the exemplary utility network interface device comprises a notification unit configured to output, external to the utility meter, notification of the tampering detected by the control unit. The control unit is configured to automatically control the notification unit to output the external notification of the tampering in response to the detection of the tampering.

Another exemplary embodiment provides a utility network comprising a first utility network interface device and a second utility network interface device. In the exemplary utility network, the first utility network interface device comprises a first detector configured to produce a state signal upon occurrence of a prescribed state that interferes with the ability of a first utility meter, with which the first utility network interface device is associated, to at least one of measure consumption of a commodity and report consumption of the commodity. The first utility network interface device also comprises a first control unit configured to detect a tampering with the first utility meter in accordance with the state signal produced by the first detector. In addition, the first utility network interface device comprises a first notification unit configured to output, external to the first utility meter, notification of the tampering detected by the first control unit to the second utility network interface device. The first control unit is configured to automatically control the first notification unit to transmit the notification to the second utility network interface device in response to the detection of the tampering.

In the exemplary utility network, the second utility network interface device comprises a second notification unit configured to receive the notification from the first notification unit. In addition, the second utility network interface device comprises a second control unit configured to automatically control the second notification unit to inform a communication station of a utility provider of the receipt of the notification, in response to receipt of the notification from the first notification unit.

Another exemplary embodiment of the present disclosure provides a computer-readable recording medium having a computer program recorded thereon that causes a computer processing unit of a utility network interface device to perform operations comprising: producing a state signal upon occurrence of a prescribed state that interferes with the ability of a utility meter, with which the utility network interface device is associated, to at least one of measure consumption of a commodity and report consumption of the commodity;

detecting a tampering with the utility meter in accordance with the state signal produced by the detector; and automatically outputting, external to the utility meter, notification of the detected tampering in response to the detection of the tampering.

In addition, an exemplary embodiment of the present disclosure provides a method of operating a utility network interface device. The exemplary method comprises producing a state signal upon occurrence of a prescribed state that interferes with the ability of a utility meter, with which the utility network interface device is associated, to at least one of measure consumption of a commodity and report consumption of the commodity. In addition, the exemplary method comprises detecting, in a computer processing unit of the utility network interface device, a tampering with the utility meter in accordance with the state signal produced by the detector. The exemplary method also comprises generating a notification of the detected tampering in the computer processing unit of the utility network interface device, and automatically outputting, external to the utility meter, the generated notification of the detected tampering in response to the detection of the tampering.

BRIEF DESCRIPTION OF THE DRAWINGS

Other objects and advantages of the present disclosure will become apparent to those skilled in the art upon reading the following detailed description of exemplary embodiments, in conjunction with the accompanying drawings, in which like reference numerals have been used to designate like elements, and in which:

FIGS. 3A-3C illustrate perspective views of an exemplary integration of a network interface card (NIC) with a utility meter;

DETAILED DESCRIPTION OF EXEMPLARY EMBODIMENTS

Figure 1:
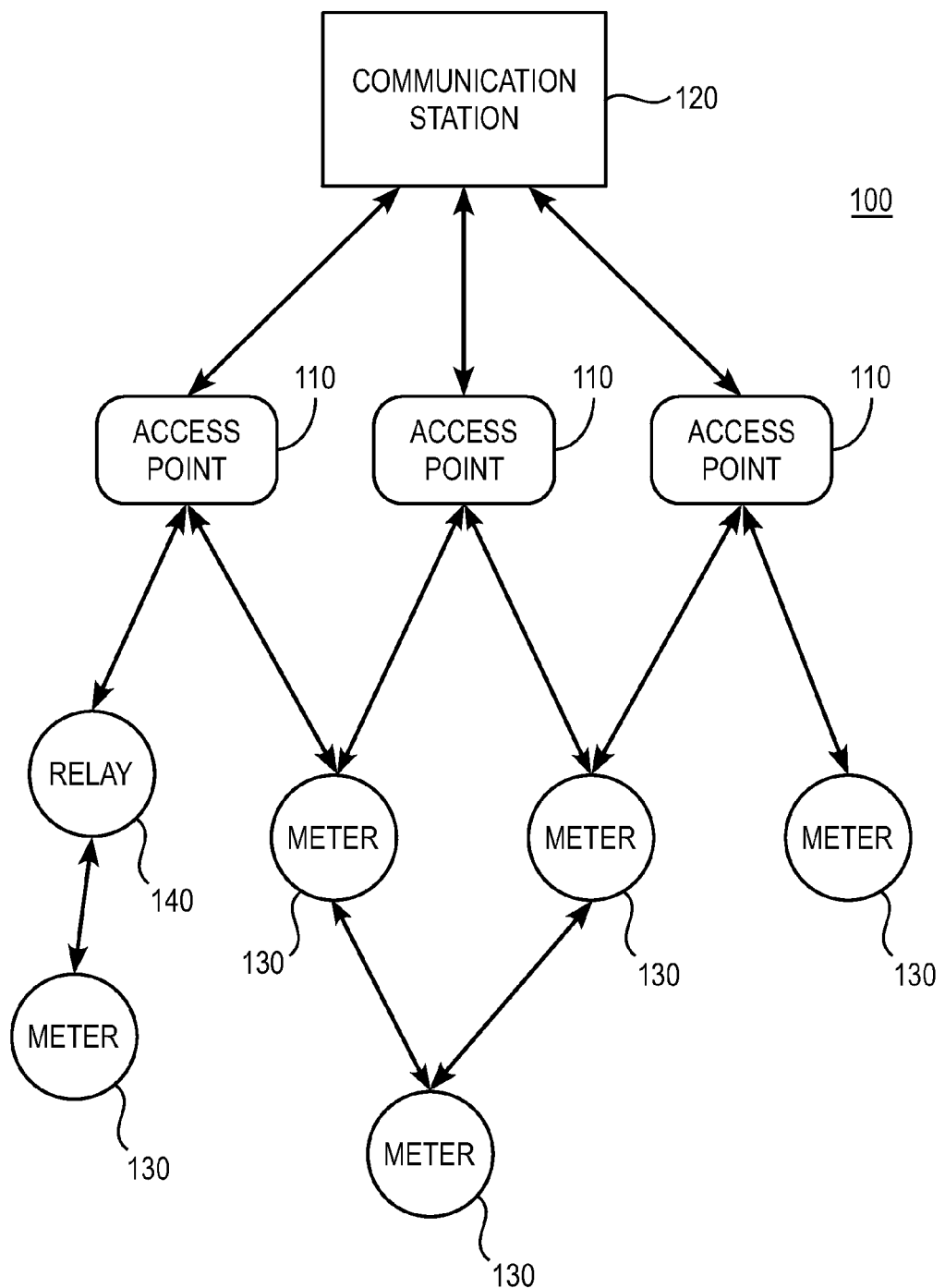
FIG. 1 is a block diagram of an exemplary configuration of an AMR/AMI network in which features of the present disclosure can be implemented.

FIG. 1 is a network diagram illustrating an exemplary configuration of an AMR/AMI network 100 in which features of the present disclosure can be implemented. FIG. 1 illustrates the AMR/AMI network 100 in the form of a mesh network, as an example of the type of network in which the present disclosure can be implemented. The present disclosure can be implemented in other types of networks. For example, the AMR/AMI network 100 can be a star network in which a plurality of nodes communicate according to predetermined communication paths with a central node, such as a communication station of a utility provider.

In the exemplary network configuration illustrated in FIG. 1, the network 100 employs one or more access points 110, e.g., gateways, that are connected to a communication station 120 of a utility provider. The connections between the access point(s) 110 and the communication station 120 may be provided by a wide area network (WAN), a virtual private network (VPN), or other suitable configuration, through wired and/or wireless communication mediums. Each access point 110 can also connect directly or indirectly with one or more utility meters 130 via a wireless local area network (LAN), for example. The utility meters 130 can communicate with each other and with the access points via the wireless LAN, to continuously keep track of preferred pathways for connection to the access points. According to an exemplary embodiment, the access points 110 can serve as an interface between the communication station 120 of the utility provider and one or more utility meters 130.

It is also conceived that a meter may communicate directly with the communication station 120 of the utility provider if an access point 110 is not within a predetermined proximity of the meter 130. Alternatively, the meter 130 may communicate directly with the communication station 120 if the quality of communication between the meter 130 and the communication station 120 exceeds the quality of communication between the meter 130 and an access point 110 or exceeds the quality of communication between the access point 110 and the communication station 120. According to an exemplary embodiment, relay stations 140 may also be provided in the network 100 as repeater stations between meters 130 and one or more of the access points 110 or communication station 120.

According to exemplary embodiments as provided herein, the utility meters 130 are enabled to communicate with each other and other nodes of the network 100 by being equipped with a utility network interface device. An example of a utility network interface device is a network interface card (NIC), which will be described in further detail herein. It will be appreciated by those skilled in the art that the operative functions performed by the utility meter 130, as described herein, can be performed by the utility network interface device (e.g., NIC) associated with the utility meter 130. The NIC can be associated with the meter 130 by being integrated in, physically attached to, and/or electrically connected to the utility meter 130. Accordingly, as used herein, any reference to a utility meter 130 is intended to encompass a utility meter 130 having a utility network interface device associated with the utility meter 130.

The addition or subtraction of utility meters 130, as nodes in the network 100, is dynamically accommodated in the network 100. Examples of techniques for connecting and/or disconnecting meters to/from an AMR/AMI network of a utility provider and establishing communication protocols between the nodes in the network are disclosed in co-pending U.S. application Ser. Nos. 11/732,964 and 12/139,413, the entire contents of which are hereby incorporated by reference. An example of a technique for establishing security protocols for added and/or disconnected nodes in a AMR/AMI network such as the network 100 illustrated in FIG. 1 is disclosed in co-pending U.S. application Ser. No. 12/187,354, the entire contents of which are hereby incorporated by reference.

Figure 2:
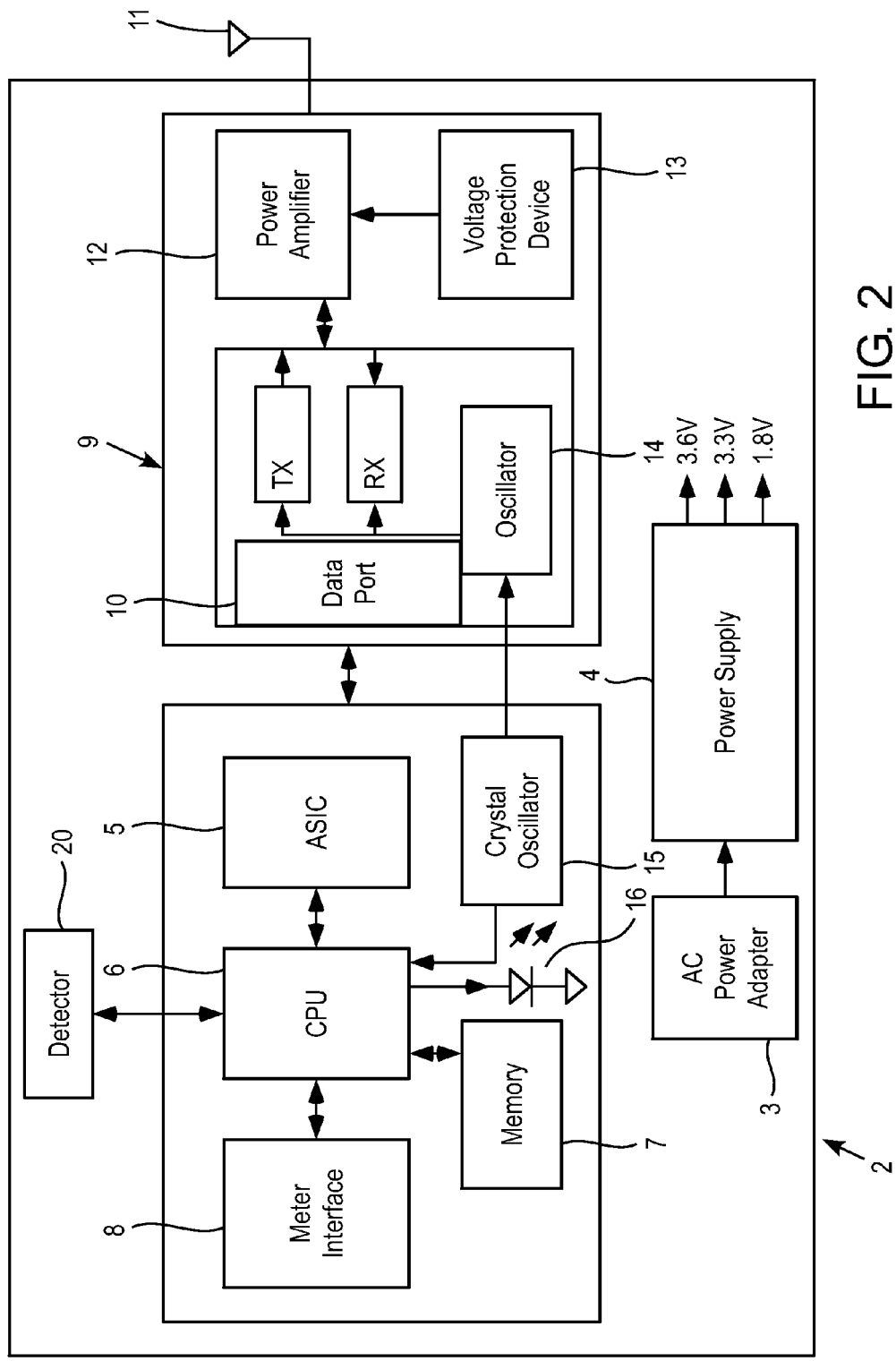
FIG. 2 is a block diagram of an exemplary configuration of a utility network interface device according to at least one embodiment.

FIG. 2 is a block diagram illustrating an exemplary configuration of a utility network interface device configured to operate in conjunction with a utility meter 130, such as gas, electric and water meters, for example. To enable the utility meters 130 to communicate with the various nodes (e.g., access points 110, communication station 120, other utility meters 130, relays 140, etc.) in the network 100, each utility meter 130 of the AMR/AMI network 100 is provided with a utility network interface device. As discussed above, a NIC is an example of a utility network interface device. A NIC 2 is a module that can be attached to or incorporated within a utility meter 130 to constitute the utility network interface device of the utility meter 130. According to an exemplary embodiment, the NIC 2 may be constituted by a single printed circuit board. FIG. 2 illustrates an exemplary configuration of a NIC 2 in which the structural components of the NIC 2 are mounted on a single printed circuit board.

As illustrated in FIG. 2, the NIC 2 may include an AC power adapter 3 and a power supply 4. The AC power adapter 3 connects an external power source to the power supply 4 to provide an input voltage to the power supply 4. The external power source may constitute a power source in the utility meter 130 to which the NIC 2 is attached, and/or a power source external to the utility meter 130. The power supply 4 converts the input voltage to various output voltages for the various powered components of the NIC 2. Alternatively or as a backup, the input voltage for the power supply 4 can be provided by a battery provided on the NIC 2.

An Application-Specific Integrated Circuit (ASIC) 5 of the NIC 2 is encoded to control the components of the NIC 2 via a Central Processing Unit (CPU) 6 and a memory 7. The CPU 6 can be an ARM7 processor, for example. The CPU 6 is configured to control the operations of the NIC 2. The CPU 6 can include, for example, a processor for controlling the aggregate operations of the NIC 2, a non-volatile memory, such as a read-only memory (ROM) and/or flash memory, for example, that stores programs, such as firmware, application programs, and logic instructions which are implemented by the processor, and a volatile memory, such as a random-access memory (RAM), for example, that is used as a working memory by the processor when executing the firmware, programs and/or logic instructions stored in the non-volatile memory. The firmware stored in the non-volatile memory includes programmed instructions for carrying out basic (i.e., fundamental) operations of the NIC 2, and may also include an operating system (OS) of the NIC 2. The feature of a "control unit" as described herein can be encompassed by the CPU 6 individually or in combination with the ASIC 5.

A meter interface 8 of the NIC 2 is operatively connected to the CPU 6 and receives measured usage data and other data from the utility meter 130. According to an exemplary embodiment, the meter interface 8 can also send information to the utility meter 130 as needed, such as a command to shut off power to the building or premises associated with the meter, for example.

A transceiver 9 is provided on the NIC 2 for communicating wirelessly with the AMR/AMI network 100. The transceiver 9 includes a data port 10 for providing a two-way data connection between the transceiver 9 and the CPU 6. Similarly, an antenna 11 provides a two-way data connection between the transceiver 9 and the AMR/AMI network 100. A power amplifier 12 drives the antenna 11 and is surge protected by a voltage protection device 13. An oscillator 14 generates a suitable carrier frequency for the power amplifier 12, e.g., 1.8 GHz. A crystal oscillator 15 generates an appropriate frequency, e.g., 9.2 MHz, which provides a stable clock signal to the CPU 6 and the ASIC 5, and also stabilizes the carrier frequency of the oscillator 14. When the meter and NIC 2 are powered up, the CPU 6 controls the transceiver 9, by way of commands received from the ASIC 5, to progress through various stages of network connection, to thereby establish the meter as a functioning node in the network 100.

In the illustrated embodiment, an LED 16 is provided on the NIC 2 and operatively connected to the CPU 6, to indicate the status of the utility meter 130 and the NIC 2 during an attempted connection of the utility meter 130 with the AMR/AMI network 100. In one embodiment, a single color LED can be used. In this case, the CPU 6 can communicate the various states of connectivity by controlling the LED 16 to vary its flash pattern. Alternatively, a multi-color LED, such as a tri-color LED, can be used, and selectively controlled by the CPU 6 to illustrate various states respectively associated with predefined color and/or flashing patterns. A more detailed discussion of these operations can be found in previously identified application Ser. No. 12/139,413.

Figure 3C:
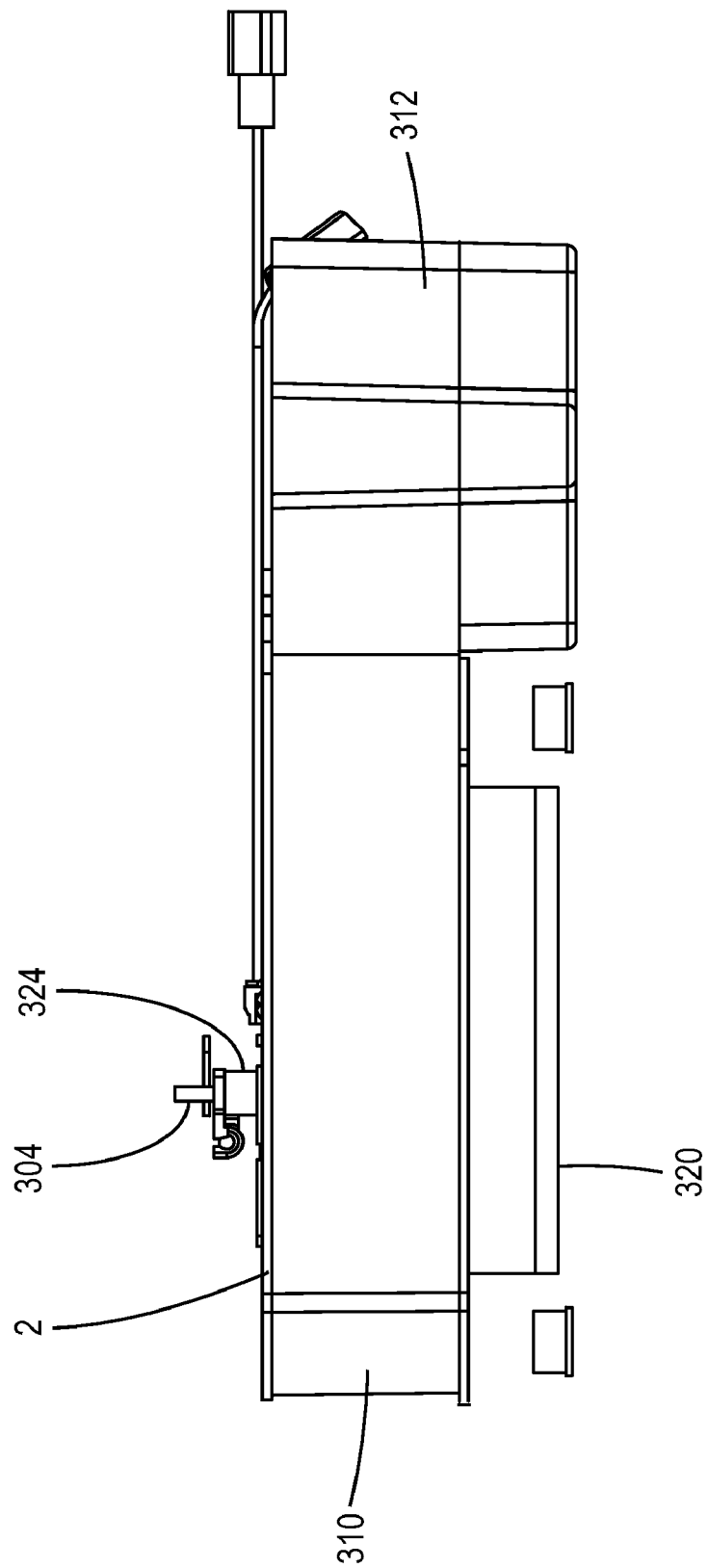

FIGS. 3A-3C illustrate perspective views of an exemplary integration of a NIC 2 with a utility meter 130. In the example of FIGS. 3A-3C, the existing meter is an electromechanical gas meter. It is to be understood that the present disclosure is not limited to the illustrative example of FIGS. 3A-3C.

FIG. 3A illustrates an exploded perspective view of an exemplary integration of a NIC 2 with a utility meter 130. The utility meter 130 includes a first segment 302 that includes a rotating member 304, which rotates in proportion to the amount of commodity consumed. For example, the rotating member 304 can be configured to rotate around an axis (e.g., a central axis substantially perpendicular to a longitudinal axis of the rotating member 304), in an amount proportional to a unit of consumption of a commodity. Reference numeral 306 denotes securing holes for receiving a fastening element, such as a screw or bolt, for example. The utility meter 130 also includes a second segment 314 that includes dials 316, which can illustrate a numerical amount of the commodity consumed in accordance with a number of rotations of the rotating member 304.

Reference numeral 310 denotes an integrating member which is integrated between the first and second segments 302, 314 of the utility meter 130. The printed circuit board on which the constituent elements of the NIC 2 are arranged is provided on the rear side of the integrating member 310 facing toward the first segment 302 of the utility meter 130. Reference number 312 denotes a power source housing section in which a battery and/or circuitry for connecting to an external power source can be housed. Reference numeral 324 denotes a measurement counter which can be connected to the rotating member 304 and rotate in correspondence with the number of revolutions of the rotating member 304. For example, the measurement counter 324 can be configured to count each unit of consumption of the commodity based on each unit of consumption of the commodity represented by a predetermined number of rotations by the rotating member 304. The number of rotations of the measurement counter 324 can, in turn, control the indicated measurement of the consumed commodity by the dials 316. It is to be understood that the measurement counter 324 is not limited to the example illustrated in FIG. 3A in which the measurement counter 324 operates in connection with the rotating member 304 of a gas meter. The measurement counter 324 can constitute any component of the NIC 2 that is connected to a component of the utility meter 130 configured to measure a unit of consumption of a particular commodity. For example, the measurement counter 324 of the NIC 2 can be any mechanical or electromechanical component which is physically in contact with and/or configured to electronically communicate with a corresponding counter in the utility meter 130.

As illustrated in the example of FIG. 3A, the second segment 314 can be secured to the integrating member 310 and the first segment 302 via fasteners 318 that can be inserted through securing holes 308 in correspondence with securing holes 306. Reference numeral 320 denotes a cover piece that provides environmental and physical security for the dials 316 of the second segment 314, the measurement counter 324, the NIC 2 and the rotating member 304 of the first segment 302. The cover piece 320 can be made of a transparent material to permit external viewing of the dials 316. The cover piece 320 can be secured to the integrating member 310 and the first segment 326. Cover plugs 322 can be provided to prevent access to one or more of the fasteners 326, and thereby protect the integrity of the integrated NIC 2 and utility meter.

FIG. 3B illustrates a front perspective view of the NIC 2 integrated with the utility meter 130 in accordance with the assembly integration illustrated in the example of FIG. 3A. FIG. 3C illustrates a perspective top view of the integrating member 310, relative to the front perspective view illustrated in FIG. 3B. FIG. 3C illustrates an example of a connection between the measurement counter 324 and the rotating member 304, and the placement of the NIC 2 on the rear side of the integrating member 310 facing the first segment 302 of the utility meter 130, opposite to the cover piece 320 provided on the front end of the integrating member 310. The measurement counter 324 can, for example, constitute part of the meter interface 8 illustrated in FIG. 2.

According to an exemplary embodiment, as illustrated in FIG. 2, the NIC 2 can include a detector 20. The detector 20 facilitates detection of a tampering with the utility meter 130 and/or its associated NIC 2. For example, the detector 20 can facilitate detection of the occurrence of a prescribed state that interferes with the ability of the utility meter 130 with which the NIC 2 is associated to measure consumption of a commodity and/or report consumption of the commodity.

Conceptually, there are several types of physical tampering that can be detected by the CPU 6 based on an output from the detector 20. For example, an individual may attempt to interfere with the functions of the utility meter 130 in measuring usage of a commodity for which the utility meter 130 is designed. Alternatively, an individual may attempt to disconnect the NIC 2 entirely from the utility meter 130, to interrupt or cease transmission of measured consumption amounts to the communication station 120 of the utility provider.

According to an exemplary embodiment, the detector 20 may be embodied by a reed switch, which is able to detect the intensity of a magnetic field and respond when the intensity of the magnetic field crosses a threshold value. A reed switch can therefore be considered to be a state switch in that its response or lack of a response represents one of two states, where one state is represented by the reed switch detecting the intensity of a magnetic field to be greater than or equal to a threshold value, and the opposite state is represented by the reed switch detecting that the intensity of the magnetic field is below the threshold value.

As one example of tamper detection, a reed switch embodying the detector 20 can have contacts that are open in an activated state in which the NIC 2 is attached to the utility meter 130. In this case, if the NIC 2 is detached from the utility meter 130, the contacts will switch to their normally closed state when the NIC 2 is no longer within a predetermined proximity of the magnetic field of a magnet included in the utility meter 130 for such detection purposes. Alternatively, the contacts of the reed switch can be closed by the magnetic field and switch to a normally open state when separated by a sufficient distance from the magnetic field of the magnet.

In several exemplary embodiments described hereinafter, a reed switch is described as an example of one type of detection component that can be embodied in the detector 20. However, it is to be understood that other state switches can be utilized instead of, or in conjunction with, a reed switch. For example, a contact switch can be employed to detect whether the NIC 2 has been physically separated from the utility meter 130. The detector 20 can also be embodied by MEMS (Microelectromechanical systems) sensors configured to detect movement, such as the movement of an outer casing of the NIC 2 away from the electrical components of the NIC 2, for example. In addition, the detector 20 can also be embodied by a current/power monitor circuit configured to transmit a notification signal to the CPU 6 if current/power to the NIC 2 has been terminated or reduced below an acceptable operating level. Moreover, the detector 20 can be embodied by a seal or tag that can communicate via RFID (radio frequency identification), for example, to indicate to an RFID reading device that the tag or seal has been tampered with or moved without authorization.

The detector 20 can be configured to automatically produce a state signal when a prescribed state is detected in connection with the NIC 2 and/or the utility meter 130 with which the NIC 2 is associated. For example, the detector 20 can produce a stage signal upon the occurrence of a prescribed state that interferes with the ability of the utility meter 130 and/or NIC 2 to measure consumption of a commodity and/or report consumption of the commodity. In the exemplary embodiment illustrated in FIG. 2, the detector 20 is a distinct component from the CPU 6 in the NIC 2, and may provide the CPU 6 with a produced state signal. However, it is to be understood that the detector 20 may alternatively be configured to operate, for example, as a switch, and supply (or cease to supply depending on the configuration of the switch) one or more components of the NIC 2 (e.g., CPU 6) with an applied voltage upon the occurrence of a prescribed state that interferes with the ability of the utility meter 130 and/or associated NIC 2 to measure consumption of a commodity and/or report consumption of the commodity.

Figure 4:
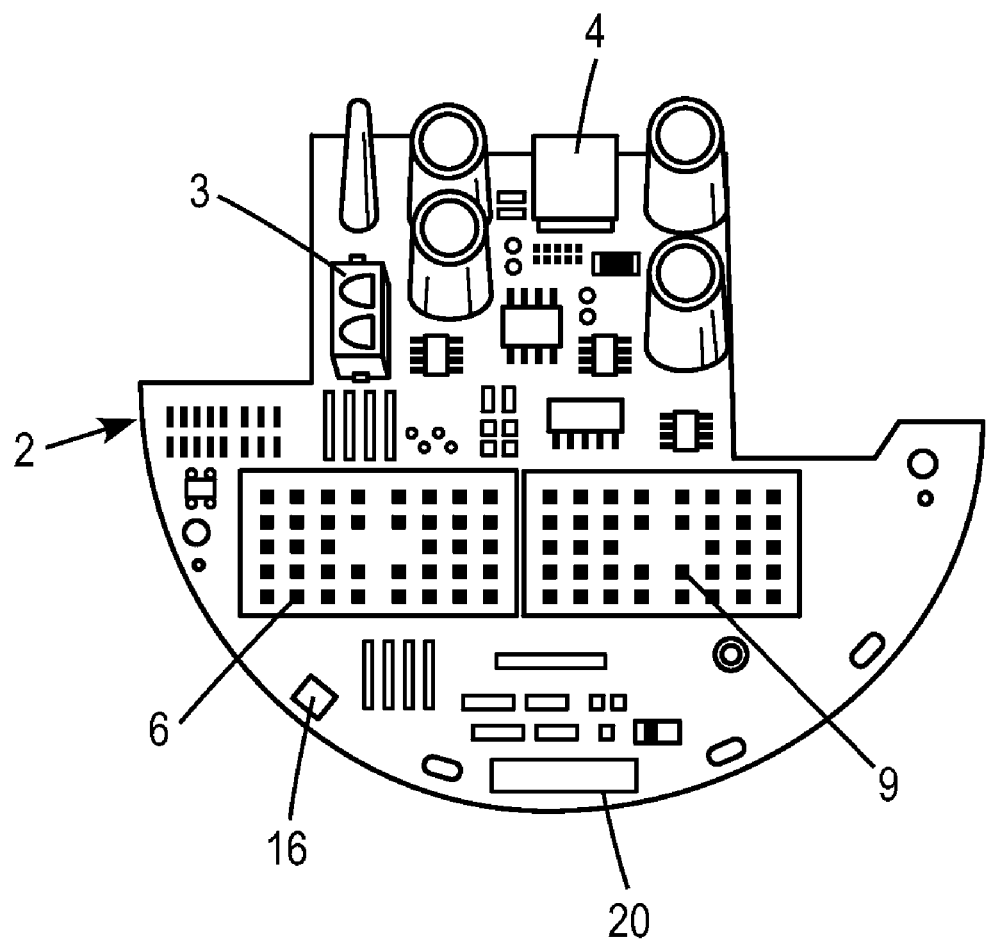
FIG. 4 illustrates an exemplary configuration of a NIC including a detector configured to detect a prescribed state.

According to an exemplary embodiment as illustrated in FIG. 4, the detector 20 can be provided on any portion of the NIC 2, and a magnet can be attached on a portion of the utility meter 130 proximate to the portion of the NIC 2 on which the detector 20 is provided. During a non-tampered state, in which the detector 20 is within the designated proximity to the magnet attached to the utility meter 130, the strength of the magnetic field will be sufficient to hold the detector 20 in its activated (non-default) state.

On the other hand, if the NIC 2 is physically separated from the utility meter 130 with which the NIC 2 is associated, the NIC 2 would not be able to collect data corresponding to the amount of commodity consumed via the meter interface 8 and/or communicate the amount of measured commodity via the transceiver 9. In the example whether the NIC 2 is physically separated from the associated utility meter 130, the reed switch in the detector 20 will switch to a different state when the separation distance is such that the magnetic field of the magnet attached to the meter is no longer sufficient to maintain the switch in its activated state. For example, upon detecting that the magnetic field is below the threshold value, the detector 20 provides a state signal (e.g., an interrupt signal) to the CPU 6.

According to an exemplary embodiment, the CPU 6 can be configured to automatically determine that the NIC 2 has been tampered with upon the production of a state signal by the detector 20, and execute an appropriate procedure, as described hereinafter. For instance, the CPU 6 can be configured to detect a tampering with the utility meter 130 and/or its associated NIC 2 in accordance with the state signal produced by the detector 20. The state signal can represent there is an interference with the ability of the utility meter 130 (including the NIC 2 associated therewith) to measure consumption of a commodity and/or report consumption of a measured commodity.

Figure 5:
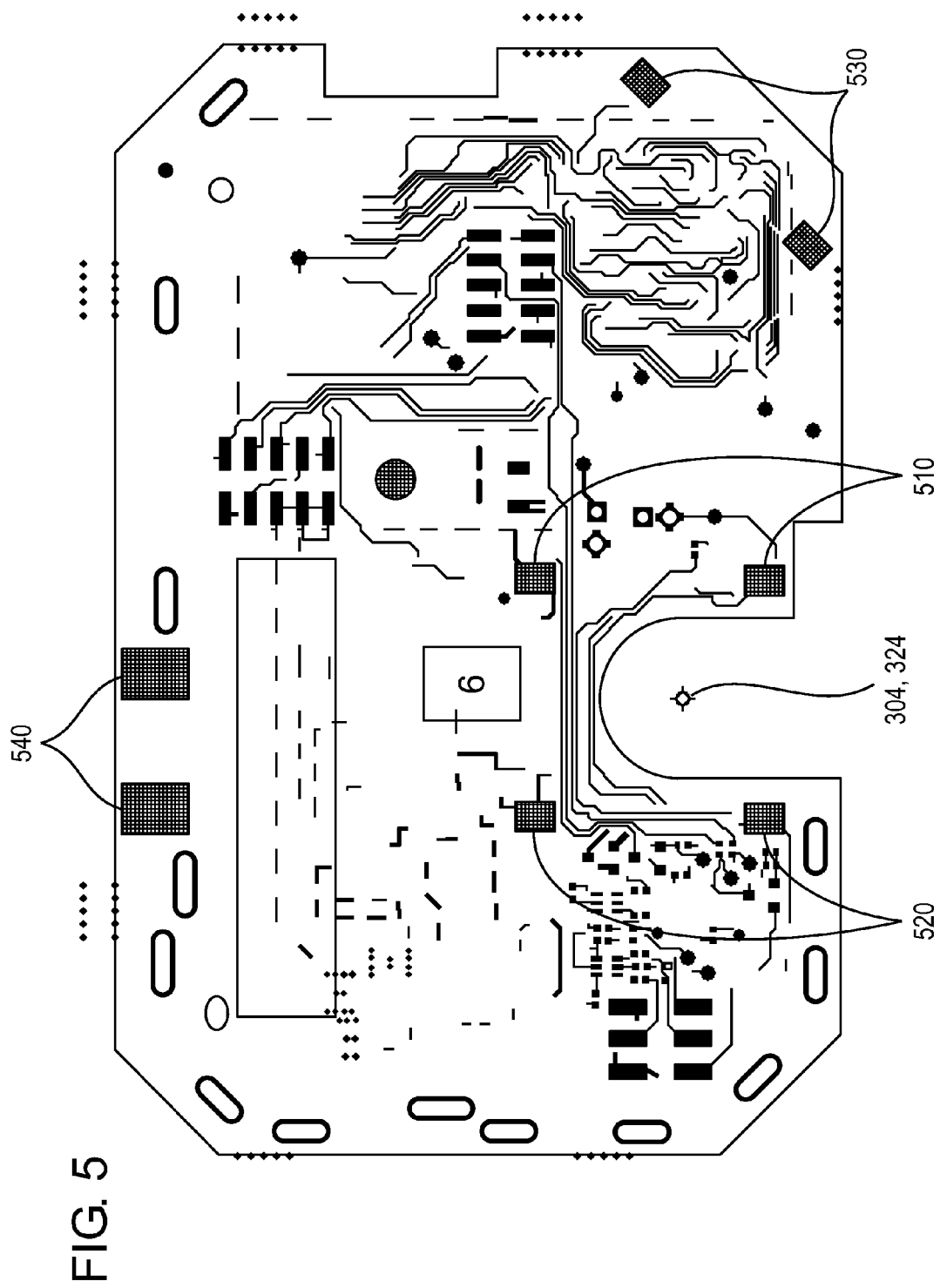
FIG. 5 is an exemplary configuration of a NIC having detectors for detecting various types of abnormalities and/or tampering.

FIG. 5 illustrates an example of the printed circuit board of a NIC 2 in accordance with the examples of FIGS. 3A-3C in which the NIC 2 is attached to a gas meter. Reference numerals 530 denote pads on which first and second terminals of a reed switch can be arranged. The placement of the pads 530 is illustrative and the present disclosure is not limited thereto.

Assume, for example, that a magnet is positioned on the utility meter 130 with which the NIC 2 is associated, in proximity to the placement of the reed switch provided on pads 530. If the NIC 2 is removed from the utility meter 130, the reed switch on pads 530 can be configured to detect that the intensity of the magnetic field of the magnet in proximity to the associated utility meter 130 is below a threshold value. The reed switch can be configured to produce and provide a state signal to the CPU 6 when detecting that the intensity of the magnetic field falls below a prescribed threshold value, i.e., such that the magnetic field of the magnet attached to the utility meter is no longer sufficient to maintain the reed switch in its activated state.

In another form of tampering, a utility meter 130 may have a rotating disk that can be representative of the amount of the commodity consumed. For example, a utility meter 130 may have a rotating disk similar to the rotating member 304 illustrated in the examples of FIGS. 3A and 3C. In such a situation, there is a possibility that an individual could place a strong magnet on the utility meter 130 in an attempt to create a counterforce that slows down the rotation of the disk and/or the measurement counter 324 of the NIC 2 integrated with the rotating disk. To detect such an occurrence, a normally open reed switch can be included in the detector 20 at a location that may be influenced by the presence of the strong field of the tampering magnet, causing the reed switch of the detector 20 to close and produce a state signal for detection by the CPU 6.

For example, the detector 20 can include a reed switch in which its first and second terminals are provided on pads 540 in FIG. 5. The reed switch on pads 540 could detect the presence of a magnetic field having an intensity sufficient to interfere with an operation of the utility meter 130 and/or associated NIC 2, such as the rotating member 304 and/or measurement counter 324, for example. The detector 20 can detect the presence of the magnet when detecting that the intensity of its magnetic field exceeds a predetermined threshold value, and produce a state signal for detection by the CPU 6.

According to an exemplary embodiment, the NIC 2 can include one or more measurement counters to measure consumption of a utility, such as the measurement counter 324 illustrated in FIGS. 3A and 3C, for example. According to the exemplary embodiment of FIG. 5, the detector 20 can include a reed switch (e.g., the reed switch on pads 540) configured to detect a presence of a magnetic field having an intensity sufficient to interfere with the measurement counter(s) 324, by detecting whether the intensity of the magnetic field exceeds a predetermined threshold value. The detector 20 can be configured to produce and provide a state signal to the CPU 6 in response to detecting that the intensity of the magnetic field is above the threshold value. Accordingly, the detector 20 can advantageously detect when an individual is attempting to alter accurate readings of consumption of a utility commodity by the placement of one or more magnets intended to interfere with the operation of the utility meter 130 or with its associated NIC 2.

According to exemplary embodiments described above, contacts and/or sensors of the state switch (e.g., reed switch) embodied in the detector 20 are configured to switch to an opposite state when the presence of a prescribed state is detected. For example, as described above, the abnormality may be the detection that a magnetic field of a magnet attached to the utility meter opposite to the detector 20 has decreased to below a threshold value. Conversely, the abnormality may be the detection that a magnetic field created by the introduction of a foreign magnet exceeds a threshold value. Accordingly, the detector 20 is configured to produce a state signal upon the occurrence of a prescribed state that interferes with the ability of the utility meter 130 and/or its associated NIC 2 to measure consumption of a commodity and/or report consumption of the commodity.

Exemplary embodiments of the present disclosure also provide a technique of detecting an abnormal operating condition, such as a tampering, by detecting whether the operation of the utility meter 130 and/or its associated NIC 2 deviate from expected operations over a predetermined period of time. Exemplary embodiments described below are configured to detect the occurrence of tampering based on whether detected operating conditions of the utility meter 130 and/or its associated NIC 2 comport with expected operating conditions during a predetermined period of time.

For instance, in the example of the utility meter 130 having the rotating disk, the rotating disk may have a small magnet on it, and a reed switch can be located adjacent to the disk to detect the magnet as it passes by the reed switch during each rotation. In the above-described exemplary embodiment, the utility meter 130 may have a disk (e.g., rotating member 304) configured to rotate around an axis of the disk, in an amount proportional to a unit of consumption of a commodity, and a magnet can be attached to a peripheral portion of the disk. The detector 20 can include one or more reed switches to detect the presence of the magnet attached to the disk when an intensity of a magnetic field of the magnet exceeds a threshold value. The detector 20 can, in turn, produce a detection signal which represents detection of consumption of the unit of the commodity, each time the detector 20 detects the presence of the magnet.

For example, the first and second terminals of a reed switch can be placed on pads 510 or pads 520, respectively, to detect a complete revolution of the measurement counter 324 integrated with the rotating member 304. This configuration is advantageous when one complete revolution of the magnet of the rotating disk represents a unit measurement of consumption. Every closure and/or opening of the reed switch (depending on the manner in which the reed switch is configured to operate) sends a pulse to a counter (e.g., measurement counter 324), to indicate a prescribed amount of consumption of the commodity being measured. In an attempt to thwart the measurement of the commodity, an individual may place a stronger magnet on the outside of the magnet of the rotating disk to hold the switch in one state or another, and thereby prevent the pulses from being generated.

In an alternative configuration, two reed switches can be provided on opposite diametric sides of the rotating disk. For example, with reference to FIG. 5, the first and second terminals of a first reed switch can be placed on pads 510, respectively, and the first and second terminals of a second reed switch can be placed on pads 520, respectively. The two reed switches send alternating pulses when they respectively detect the passing of the magnet as the rotating disk rotates. If the tampering magnet is only strong enough to hold one of the two reed switches in a given state, such as the reed switch closer to the outer wall of the NIC 2, for example, the other reed switch will continue to generate pulses. The CPU 6 can detect that only one reed switch is sending pulses, in which case the CPU 6 can automatically detect an abnormal operating condition, such as a tampering with the utility meter 130 and/or its associated NIC 2.

Alternatively, if the tampering magnet is strong enough to hold both switches in a steady state, the CPU 6 can detect the absence of any activity from the two switches over some defined period of time. For example, the memory 7 can have pre-stored therein an expected level of pulses to be detected for a given period of time. Alternatively, the transceiver 9 can receive updated data concerning expected pulse detection values, and the CPU 6 can store such updated data in the memory 7. Upon detecting the absence of any pulses or a number of pulses below a threshold value during a particular period of time, the CPU 6 can determine that there is a malfunction which could be the result of tampering.

In the above-described examples in which the rotating disk has a magnet and the reed switch(es) transmit a pulse each time the magnet of the rotating disk passes thereby, the transmitted pulses each represent a detected amount of commodity measurement. For example, one complete revolution of the magnet on the rotating disk may represent the consumption of a specified unit of the commodity. The CPU 6, based on pre-stored or acquired expected pulse detection values, can detect an abnormal operating condition, such as tampering with the utility meter 130 and/or the NIC 2, if the number of detection signals received from the detector 20 is below the expected pulse detection values for a particular period of time. For example, the CPU 6 can access data recorded in the memory 7 that represents a threshold value for a number of expected pulse detections over a particular period of time. The CPU 6 can then detect whether there is a tampering with the utility meter 130 when the number of detection signals (e.g., pulses) produced by the detector 20 is below the threshold value recorded in the memory 7. The NIC 2 can also receive updated threshold data via the transceiver 9, for example, from a node in the network. The update threshold data represents an update to the threshold value data recorded in the memory 7. Upon receiving the updated threshold data, the CPU 6 can control the memory 7 to record the updated threshold data. For example, the CPU 6 can cause the memory 7 to overwrite the prior threshold value data with the updated threshold data. Alternatively, the CPU 6 can control the memory 7 to store varied threshold data for different time periods. For example, the CPU 6 can control the memory 7 to store threshold data for months in the summer and different threshold data for months in the winter.

In accordance with exemplary embodiments described above, the CPU 6 is able to autonomously detect that the NIC 2 has been tampered with based on a state signal(s) produced by the detector 20 to the CPU 6. In addition or alternatively, when the detector 20 transmits a detection signal upon occurrence of each detected unit measurement of a commodity in the utility meter 130, the CPU 6 is configured to detect a tampering with the utility meter 130 and/or the associated NIC 2 when a number of detection signals received from the detector 20 over a predetermined period of time is below a threshold value. Accordingly, the CPU 6 is configured to detect an abnormal operating condition, such as a tampering, using either or both of these techniques.

The above-described embodiments are directed to the detection of an example of an abnormal operating condition, namely the detection of a physical tampering with the NIC 2. In addition, the CPU 6 of a NIC 2 can also be configured to detect tampering and/or an abnormality with the software and security protocols of the NIC 2.

As illustrated in FIG. 2, each NIC 2 includes a memory 7. According to an exemplary embodiment, the memory 7 is a non-volatile memory, as one example of a computer-readable recording medium. As discussed above, the CPU 6 can include a non-volatile memory such as a ROM, and a volatile memory such as a RAM, for example. One or more of such non-volatile recording mediums of the NIC 2 may have recorded thereon an image corresponding to the set of software executable in the NIC 2 by the CPU 6. According to an exemplary embodiment, the software image may correspond to the firmware of the NIC 2. The software image may be pre-stored when the NIC 2 is installed at the site of the utility meter 130, or the software image may be acquired and/or updated upon obtaining security keys that enable the NIC 2 to communicate with neighboring nodes and the communication station 120 of the utility provider. An example of a technique for authenticating a node added to an ARM/AMI network 100 and establishing security keys that enable the node to communicate, as a full-fledged network node, with neighboring nodes, access points, relay stations and a communication station of a utility provider is disclosed in the above-described U.S. application Ser. No. 12/187,354, whose entire contents have been incorporated by reference herein.

While physical tampering can be more apparent to the human eye, tampering with a software component of a utility meter 130 is generally less apparent. The CPU 6 of a NIC 2 executes a software-based operating system, and can execute one or more application software programs via the operating system. In addition, each NIC 2 has been assigned and can acquire security-based information that include, for example, security keys and/or security certificates which are used to authenticate the associated meter 130 during communication with another node in the network. As used herein, the term "software component" is intended to encompass one or more of the operating system of the NIC 2, application programs executable by the CPU 6 of the NIC 2, and the security-based information of the NIC 2. Accordingly, as used herein, the discussion of a tampering with a software component of the meter 130 is intended to encompass one or more of a tampering with the operating system of the NIC 2, an application program executed by the CPU 6 of the NIC 2, and/or the security-based information of the NIC 2.

The present disclosure provides several techniques of detecting tampering with the software components of a utility meter 130. A first technique is that the CPU 6 of the NIC 2 autonomously detects that one or more software components of the NIC 2 have been tampered with or corrupted for some reason. A second technique is that a neighboring node, through its communication with a NIC 2, detects that one or more of the software components of the NIC 2 have been tampered with or corrupted. A third technique is that the communication station 120 of the utility provider, upon receiving one or more communications from a node, whether directly or indirectly, can determine that one or more of the software components of the NIC 2 have been tampered with or corrupted. These exemplary techniques will be further discussed below individually. It is to be understood, however, that these techniques can be implemented and utilized in combination.

Each NIC 2 has a secure bootloader. The security keys stored in the memory of the NIC 2 may correspond to the image recorded in the memory of the NIC 2 and may be utilized to verify a signature of the recorded image. Therefore, as one type of tamper detection provided herein, when the CPU 6 boots to a software image that is not secure, the CPU 6 can determine that the signature of the software does not match a signature obtainable by the security key(s) stored in the NIC 2, and thereby detect an abnormal operating condition. Accordingly, the CPU 6 can detect corruption and/or tampering of an executable image based on mismatched security keys. For example, if a hacker surreptitiously loads an altered image or virus to corrupt the image already stored in the non-volatile memory of the NIC 2, the CPU 6 can be configured to autonomously detect the existence of such tampering.

Another example of an abnormal operating condition is where the security keys of the NIC 2 have become corrupted for some reason, e.g., tampering. In this case, the NIC 2 will not be able to successfully communicate with the communication station 120 because the security credentials of the NIC 2 have been corrupted. According to an exemplary embodiment, the CPU 6 of the NIC 2 having the corrupted key(s) can self-detect that its key(s) have been corrupted. For example, if, by convention, the NIC 2 receives a confirmation message from a neighboring node and/or the communication station 120 when transmitting a message to the neighboring node and/or communication station 120, and the NIC 2 having the corrupted key(s) does not receive such a confirmation message, the CPU 6 can be configured to detect that the security key(s) of the NIC 2 have been corrupted. Alternatively, if the CPU 6 receives, via the transceiver 9, a message from a neighboring node or the communication station 120 indicating that its communication transmitted thereto is not being accepted, the CPU 6 can detect that the security key(s) have been corrupted. Similarly, if the CPU 6 receives, via the transceiver 9, a message from the communication station 120 that its security key(s) have been corrupted, the CPU 6 can process the message and determine that an abnormal operating condition exists.

According to the second technique described above for detecting tampering with a software component of a utility meter 130, a NIC 2 can autonomously detect an abnormal operating condition in connection with a neighboring node, based on its communication with the neighboring node. For example, if the NIC 2 detects a number of requests from a neighboring node to relay messages to other nodes or the communication station 120 that exceed a threshold for a given period of time, the CPU 6 determines that the authentication credentials of the neighboring node may be corrupted and/or invalid. In this case, the CPU 6 can instruct the transceiver 9 to transmit a notification of an abnormal operating condition associated with the neighboring node. The CPU 6 can specifically identify the neighboring node in the notification transmitted to the central station. In addition, the CPU 6 may be configured to detect abnormal operating conditions in terms of the amount of traffic seen in the network 100, the authentication credentials it receives from direct neighbors or any abnormal fluctuation in power state that the CPU detects. If any of these detected values exceeds a threshold value stored in a memory of the NIC 2, the CPU 6 can then determine that an abnormal operating condition may exist, and transmit a notification signal to the communication station 120.

According to the third technique described above, the communication station 120 can be configured to detect a tampering or other abnormal operating condition with a NIC 2 in the network based on a communication received, directly or indirectly, from that NIC 2. For example, if the communication station 120 receives a message from a NIC 2, but the message does not possess the requisite security credentials, the communication station 120 can be configured to notify the NIC 2 of a possible tampering, and notify the other nodes in the network that the NIC 2 is not to be trusted until otherwise informed, because of the suspected tampering with the NIC 2.

In accordance with the above-described embodiments, the CPU 6 can then automatically control a notification unit (e.g., the transceiver 9, LED(s) 16, display 19, etc.) of the utility meter 130 to output, external to the utility meter 130, notification of the tampering detected by the CPU 6.

The type of notification can depend on the type of tampering detected by the CPU 6. For example, in the case of a physical tampering, the CPU 6 can automatically generate a tampering notification signal and control the transceiver 9 to transmit the tampering notification signal to a neighboring node in the network 100 with which the NIC 2 is able to communicate. According to an exemplary embodiment, the CPU 6 can be configured to automatically control the transceiver 9 to output the external notification of the abnormal event and/or tampering, in response to the detection of the abnormal event and/or tampering, so that another node in the network 100 (e.g., the communication station 120) is informed of the detected abnormality at the time the abnormality is detected. For example, the CPU 6 can be configured to generate an abnormality notification signal and control the transceiver 9 to transmit the abnormality notification signal to a node within the network 100, in response to the detection of the tamper or abnormal operating condition, so that the tamper or abnormal operation condition can be notified to the communication station 120 of the utility provider in real-time, i.e., at the time that the tamper or abnormal operating condition was detected by the CPU 6 to have occurred. According to an exemplary embodiment, the CPU 6 can control the transceiver 9 to transmit the notification signal wirelessly to another node and/or the communication station 120 of the utility provider. Alternatively or in addition, the CPU 6 can control the transceiver 9 to transmit the notification signal through wired transmission mediums.

For example, upon determining that there has been a tamper with the NIC 2, the CPU 6 can be configured to control the transceiver 9 to transmit an abnormality notification signal destined for a neighboring node with which the NIC 2 previously communicated and/or is authorized to communicate. Alternatively, the node that detected an abnormality can transmit the abnormality notification signal to the communication station 120 as its destination, either directly or via another node, access point 110, relay station 140, etc. An example of a technique utilized by a node in an AMR/AMI network such as the network 100 for identifying neighboring nodes and determining which of the neighboring nodes to use for reliable transmission and reception of communications to/from the communication station 120 of the utility provider is disclosed in U.S. application Ser. No. 11/560,938, the entire contents of which are hereby incorporated by reference.

In addition to or as an alternative to the transceiver 9 transmitting a tamper notification signal to another node in the network 100, the CPU 6 can control the notification unit to output a visual indication of the tampering, in response to the detection of the tampering. For example, in the case of detecting tampering with a software component of a utility meter 130, the CPU 6 of the NIC 2 associated with that meter may control the notification unit to visually display a tampering notification, to assist utility personnel with diagnosing the detected abnormality, for example, when dispatched to the location of the utility meter 130. In the examples described above with reference to the first through third techniques of detecting tampering with a software component of a utility meter 130, which techniques can be combined as appropriate, the CPU 6 of the NIC 2 detecting the tampering or other abnormal operating condition can be configured to output, external to the NIC 2, notification of the detected abnormal operating condition to the communication station 120, so that personnel of the utility provider can take appropriate action in resolving the abnormal operating condition. The CPU 6 of the NIC 2 in which the abnormal operating condition was detected can cause its transceiver 9 to transmit a notification signal wirelessly to another node in the network 100. Alternatively or in addition, the CPU 6 of the NIC 2 in which the abnormal operating condition was detected can activate an indicator device within the NIC 2 or external thereto to visually display the notification. For example, the CPU 6 of the NIC 2 can cause the LED 16 to display a representation of the notification according to a predetermined pattern of illuminating the LED 16. In FIG. 2, one LED 16 is illustrated. However, additional LEDs may be provided, and the LEDs may be single or multi-color.

According to an exemplary embodiment, the CPU 6 can be configured to illuminate the LED(s) 16 according to a pattern associated with a type of tampering detected by the CPU 6. For example, the CPU 6 can cause the LED(s) 16 to display a first pattern associated with the NIC 2 having invalid security keys, a second pattern associated with the NIC 2 being unable to find a secure image to which to boot, and a third pattern associated with the CPU 6 detecting that the NIC 2 has received too many messages within a certain time period. Additional patterns may be associated with other types of tampering or other types of abnormal operating conditions, such as receiving too many messages within a certain time period from nodes having invalid security credentials, and the NIC 2 operating according to a different software version than the other nodes in the network, for example. The CPU 6 can be configured to cause the LED(s) 16 to display one pattern at a time, although it is also conceived that the LED(s) 16 can display different patterns in succession when there are different types of abnormal operating conditions.

For example, according to an exemplary embodiment, the CPU 6 can be configured to detect a plurality of different types of abnormal operating conditions and/or tampering, and control the indicator device to illuminate the LED(s) 16 according to a plurality of unique patterns that are each respectively associated with one of the plurality of different types of tampering. The memory 7 of the NIC 2 can be configured to store prioritization data identifying a predefined order of priority respectively attributed to each one of the plurality of different types of tampering. The prioritization data can be pre-stored in the memory 7, and can also be subsequently updated during interaction with other nodes in the network. The CPU 6, upon detecting different types of tampering in association with the NIC 2 and/or the associated utility meter 130, can be configured to access the prioritization data stored in the memory 7 and prioritize the detected types of tampering according to the prioritization data. The CPU 6, when detecting the different types of tampering, can be configured to control the indicator device to successively illuminate the LED(s) 16 according to the unique patterns respectively associated with the detected types of tampering in a sequential order corresponding to the prioritized detected types of tampering. For example, if the CPU 6 detects multiple instances of tampering, the CPU 6 can control the indicator device to first display a visual indication of a tampering that is, according to the prioritization data, perceived to be more threatening to the operation of the NIC 2 and/or the associated utility meter 130.

For example, according to an exemplary embodiment, the types of tampering defined in the memory 7 can include (i) a corrupted or insecure software image executed by or to be executed by a processor of the NIC 2 (e.g., the CPU 6), (ii) a corruption of a security key with which the utility network interface device is enabled to communicate with a node in a network of which the NIC 2 is a member, and (iii) receipt of a predetermined number of communications with invalid credentials from at least one other NIC 2 in the network. In addition, the prioritization data stored in the memory unit can identify the aforementioned identifies tampering types (i)-(iii) by an order of priority in which tampering type (i) has the greatest priority and tampering type (iii) has the lowest priority, for example.

Figure 6:
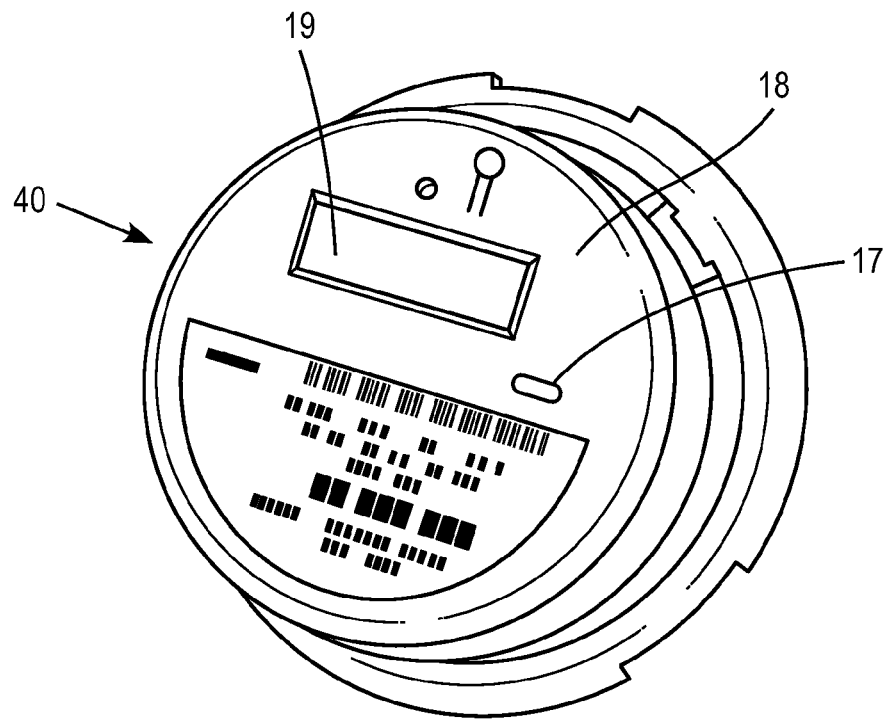
FIG. 6 is an exemplary configuration of a NIC having an indicator device according to at least one embodiment.
Figure 7:
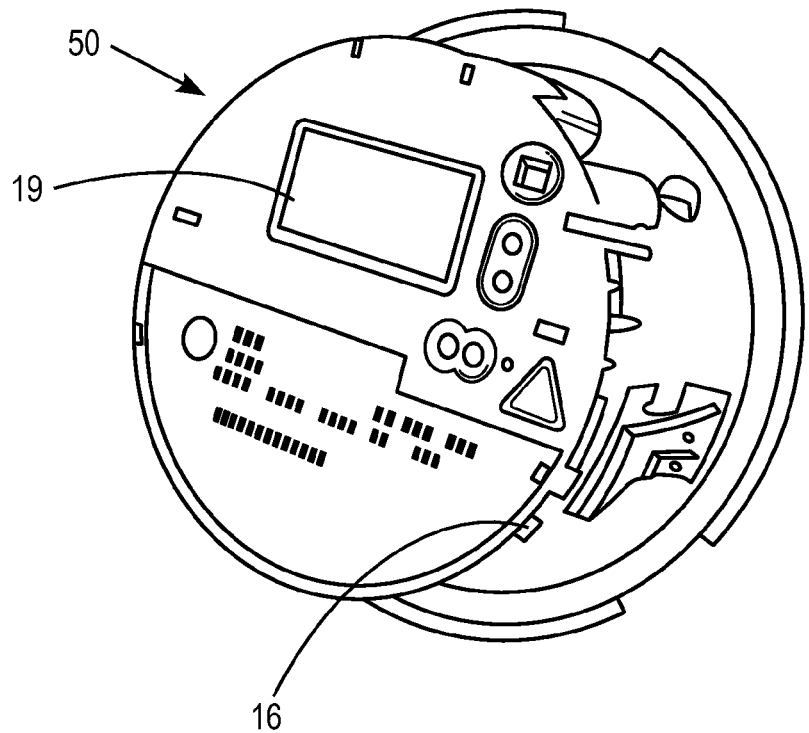
FIG. 7 is an exemplary configuration of a NIC having an indicator device according to at least one embodiment.

The CPU 6 can also be configured to output a representation of the abnormal operating condition detected on a digital display provided on the NIC 2 or provided on the utility meter 130 with which the NIC 2 is associated. For example, for a closed case utility meter 40 as depicted in FIG. 6, the CPU 6 can be configured to instruct a digital display 19 and associated circuitry to display a notification thereon. The CPU 6 can be configured to cause the digital display 19 to display an alphanumeric representation of a tampering detected by the CPU 6, such as a code representing the type of the detected tamper. In the example of FIG. 6, the LED 16 can be made visible through a window 17 in the front of the case 18. For an open case utility meter 50 as illustrated in FIG. 7, the LED 16 can be made visible at the side of the meter 50, for example.

In addition to outputting a notification of tampering or other abnormal operating condition, the CPU 6 can be configured to store each tamper or abnormal event that is detected to have occurred in a non-volatile memory of the NIC 2, e.g., the memory 7 illustrated in FIG. 2. For example, the CPU 6 can be configured to record in the memory 7 data respectively representing each instance of tampering detected by the CPU 6. According to an exemplary embodiment, the CPU 6 can control the memory 7 to record each instance of tampering and/or abnormal event together with a timestamp indicating when the tampering and/or abnormal event first occurred and the duration of the tampering and/or abnormal event, respectively.

The foregoing exemplary embodiments were described to provide examples of types of tampering, such as physical, software-based or security-based tampering, for example, and the techniques of the CPU 6 in detecting the tampering and thereafter automatically controlling the transceiver 9 to output an external notification of the detected abnormal operating condition, in response to the detected abnormal operating condition. According to an exemplary embodiment, the CPU 6 generates the notification signal immediately upon the detection of the abnormal operating condition and controls the transceiver 9 to transmit the notification signal at the time that the abnormal operating condition is detected. Therefore, the CPU 6 can be configured to provide the communication station 120 with real-time notification of an abnormal operating condition detected in association with the NIC 2 and/or the utility meter to which the NIC 2 is attached.

Accordingly, once the CPU 6 has detected a tamper or other abnormal operating condition, the CPU 6 is configured to promptly notify the communication station 120 so that appropriate action can be taken. In accordance with various aspects of the above-described embodiments, the CPU 6 can instruct that the notification message be transmitted by the transceiver 9 and/or displayed by the indicator device (e.g., LED 16, digital display 19). Accordingly, the CPU 6 can instruct that a notification signal be transmitted to another node in the network, in lieu of or in combination with visually displaying the tampering notification according to a visual indication pattern associated with the abnormal operating condition and/or tampering detected by the CPU 6.

In the case of a physical, software or security-based tampering, the particular technique of communicating the tampering to the communication station 120 may depend on the type of tampering detected. For example, if the NIC 2 is physically tampered with, the CPU 6 can control the transceiver 9 to transmit a notification signal to a neighboring node with which the NIC 2 was most recently communicating or with another neighboring node with which the NIC 2 is authorized to communicate, based on its security credentials. The CPU 6 may also be configured with determinative processing instructions to determine whether to notify a neighboring node, which will in turn notify the communication station 120, notify the communication station 120 directly, or transmit a broadcast message to an indiscriminate number of nodes with the expectation that any node receiving the broadcasted communication will convey it to the communication station 120.

The option between notifying the communication station 120 directly or relying upon at least one other neighboring node to notify the communication station 120 can depend on the tamper and/or abnormal condition that the CPU 6 detects. For example, if the CPU 6 determines that the NIC 2 is losing power or may not have time to reliably transmit the abnormality notification signal to the communication station 120 directly, the NIC 2 can transmit the abnormality notification signal to a neighboring node with which the NIC 2 has previously communicated.

In the example where a NIC 2 has its key(s) corrupted or lost, the NIC 2 is not able to communicate fully with neighboring nodes, because the neighboring nodes, even if they previously communicated with the NIC 2, are configured not to trust a node with unproven credentials. Furthermore, if the security key(s) of an NIC 2 are corrupted, the NIC 2 cannot communicate with the communication station 120 because it does not possess the requisite clearance. As such, the node cannot fully join the network without authenticated security keys. However, at least one embodiment of the present disclosure implements the link-layer scheme as disclosed in U.S. application Ser. No. 12/187,354. According to the link-layer scheme, the NIC 2 having corrupted or unauthenticated security keys is allowed to relay a limited number of message types to neighboring nodes, at a limited rate. Thus, if the CPU 6 detects that its security key(s) are corrupted or not authorized, the NIC 2 can inform a neighboring node, which will in turn notify the communication station 120. The communication station 120 can also transmit a query message to the NIC 2 having the corrupted security key(s) directly or via another node, to inspect what remains of the keys in the memory of the NIC 2 or to determine other debugging processes to be taken, such as logging a reboot, event log, etc. In the case where one NIC 2 loses its keys and does not automatically notify the communication station 120, the communication station 120 can query another node in the vicinity of the NIC 2, to relay the query message to the NIC 2 having the lost keys.

Accordingly, for several types of software- or security-based tampering, e.g., lost keys, invalid certificate, attempt to load an incorrect image, etc., the NIC 2 is not disabled, and can still communicate with its nearest neighbors. However, because these conditions might pose a security concern, the level of trust afforded to the tampered or corrupted NIC 2 might be reduced. For some types of tampering, e.g., corrupted keys, the CPU 6 of the NIC 2 can be configured to detect the condition itself, and automatically inform the communication station 120 of the detected abnormality. On the other hand, if a neighboring node receives a communication from a tampered or corrupted NIC 2, the neighboring node can be configured to, on its own accord, generate and transmit a notification signal to the communication station 120 informing the communication station 120 of the abnormal operating condition associated with the NIC 2. The communication station 120 can, for example, instruct the CPU 6 of the neighboring node to transmit a shut-down signal (e.g., an override signal) to the corrupted NIC 2 to cause the corrupted NIC 2 to terminate one or more of its operations.

As described above, the NIC 2, when determining to transmit a notification signal to another node in the network, can detect what mode of communication to pursue based on the detected abnormal operating condition and/or tampering and the current level of trust that the NIC 2 has in the network. According to an exemplary embodiment, the memory 7 of the NIC 2 can have recorded therein tampering type data respectively representing different types of detectable tampering. The CPU 6 can determine which one of three modes communication to utilize in transmitting notification of a detected abnormal operating condition and/or tampering, based on the detected abnormal operating condition and/or tampering and the tampering type data recorded in the memory 7. The CPU 6 can be configured to generate the notification signal to contain data representative of the tampering notification, an identification of the NIC 2, and a destination address of at least one node in the utility network of which the NIC 2 is a member, according to one of three modes of communication.

According to a first mode among the three modes of communication, the CPU 6 generates the notification signal to contain the communication station 120 of the utility provider as the destination address. For example, in the case where the ability of the NIC 2 to communicate is hampered, e.g., the NIC 2 may be able to transmit only one message and may not have time to wait for an acknowledgement message from the communication station 120, the NIC 2 may transmit a notification signal directly to the communication station 120, without utilizing a neighboring node as a relay or proxy node.

According to a second mode among the three modes of communication, the CPU 6 generates the notification signal to contain a specific neighboring node of the utility network as the destination address. For example, in the case where the ability of the NIC 2 to communicate is not hampered, e.g., the security credentials of the NIC 2 are not corrupted, the NIC 2 may be able to transmit multiple messages and receive acknowledgements for each transmitted message. In this case, the CPU 6 can determine to utilize one or more specific nodes as a proxy or relay node for communicating with the communication station 120. However, it is also possible that the CPU 6 is not aware that its security credentials have been comprised, in which case a neighboring node can inform the communication station 120 of the corruption of the NIC 2.

According to a third mode among the three modes of communication, the CPU 6 generates the notification signal to contain the destination address of any node in the network. For example, the CPU 6 can generate a broadcast message that does not specifically identify one or more particular nodes in the network, and thus, any node in the network can act as a relay or proxy for the CPU 6.

Accordingly, the above-described exemplary embodiments provide a utility network interface device 2 having a CPU 6 that is configured to autonomously detect a tampering or other abnormal operating condition of the NIC 2. The CPU 6 may detect the prescribed state in accordance with a state signal produced by the detector 20 included in the NIC 2, or may self-detect the prescribed state in accordance with the recognition of abnormal operating conditions. For example, the prescribed state may be the detection that intensity of a magnetic field is below a threshold value, that the software or security protocols of the NIC 2 have been corrupted, and/or that the CPU 6 receives notification that it has been tampered with or corrupted from another node in the network 100. Furthermore, according to the above-described exemplary embodiments, the NIC 2 is configured to automatically output notification of the tampering event or other abnormal operating condition in response to the detected tampering, so that the abnormality can be remedied.

As illustrated in the example of FIG. 1, a NIC 2 integrated with a meter 130 is a member of a network. According to an exemplary embodiment, the CPU 6 of the NIC 2 which has suffered from the abnormal operating condition or tamper can utilize another node in the network as a relay or proxy to communicate with the communication station 120 of the utility provider, or the CPU 6 can determine to attempt to communicate with the communication station 120 directly.

An exemplary embodiment of the present disclosure provides a utility network (e.g., network 100) including a first utility meter 130-1 having a first NIC 2-1 and a second utility meter 130-2 having a second NIC 2-2. The NIC 2-1 of the first utility meter 130 includes a CPU 6 configured to detect a tampering with the first utility meter 130 and/or its associated NIC 2-1, in accordance with any of the above-described exemplary embodiments. The NIC 2-1 of the first utility meter 130-1 also includes a first communication unit (e.g., transceiver 9, LED(s) 16, digital display 19) configured to output, external to the first utility meter 130-1, notification of the abnormal operating condition and/or tampering detected by the CPU 6 of the first utility meter 130-1 to the second utility meter 130-2. The CPU 6 of the first NIC 2-1 can be configured to automatically control the first communication unit to transmit the notification to the second utility meter 130-2 in response to the detection of the abnormal operating condition and/or tampering. According to an exemplary embodiment, the second utility meter 130-2 includes a communication unit (e.g., transceiver 9) configured to receive the notification from the first NIC, and a CPU 6 configured to automatically control the second NIC to inform the communication station 120 of a utility provider of the receipt of the notification of the abnormal operating condition and/or tampering, in response to receipt of the notification from the first NIC.

The CPU 6 of the first NIC 2-1 can control the transceiver 9 of the first utility meter 130-1 to wirelessly transmit a notification signal, which contains data representative of the tampering notification and an identification of the first utility meter 130-1 to the second utility meter 130-2. The transceiver 9 of the second utility meter 130-2 can receive the notification signal transmitted wirelessly from the transceiver of the first NIC, and the CPU 6 of the second NIC can control its transceiver 9 to transmit the notification signal to the communication station 120 of the utility provider.

According to an exemplary embodiment, the second utility meter 130-2 and its associated NIC 2-2 receiving the notification signal can operate as a relay for the first utility meter 130-1, or the second utility meter 130-2 can operate as a proxy for the first utility meter 130-1. When operating as a relay for the first utility meter 130-1, the CPU 6 of the second NIC 2-2 controls its transceiver 9 to transmit the notification signal that it received to the communication station 120 of the utility provider, whether directly or through an intermediate node.

On the other hand, when operating as a proxy for the first utility meter 130-1, the CPU 6 of the second NIC 2-2 is configured to newly generate a tampering (abnormality) receipt signal upon receiving the notification signal from the first NIC. The tampering receipt signal can contain data representative of receipt of the notification signal and the identification of the first utility network interface device. The CPU 6 of the second NIC then controls its transceiver 9 to transmit the generated tampering receipt signal to the communication station 120 of the utility provider, in response to receiving the notification signal from the first NIC.

In either case of operating as a relay or proxy, the CPU 6 of the second utility meter 130-2 can control its transceiver 9 to re-transmit the notification signal or the tampering receipt signal to the communication station 120 of the utility provider, if the transceiver 9 of the second utility meter 130-2 does not receive an acknowledgement message from the communication station 120 of the utility provider within a predetermined period of time from when the transceiver 9 of the second utility meter 130-2 transmitted the tampering receipt signal or notification signal to the communication station 120.

The abnormality notification signal can include data representative of the tampering notification. In addition, the notification signal can include an identification of the NIC 2 and/or its associated utility meter 130, such as a network or MAC ID uniquely assigned to the NIC 2, for example, so that the communication station 120 of the utility provider is informed of the NIC 2 and/or the utility meter associated with the NIC 2 which has suffered from the abnormal operating condition and/or tampering. The notification signal can inform the recipient node that an abnormality has occurred with the NIC 2. For example, the abnormality notification signal can indicate to the neighboring node that the NIC 2 has been tampered with, and/or that the NIC 2 is operating abnormally.

The CPU 6 of an abnormally operating utility meter 130 and/or NIC 2 can be configured to identify an estimated type of the tampering and/or abnormal operating condition. For example, the memory 7 of the NIC 2 can have recorded therein data that is representative of defined types of tampering and/or abnormal operating conditions that are detectable by the CPU 6. The CPU 6 can be configured to estimate a type of the detected abnormal operating condition and/or tampering based on the defined types of abnormal operating conditions and/or tampering recorded in the memory 7, and include data representative of the estimated type of abnormal operating condition and/or tampering in the notification signal to be transmitted to a neighboring node. In addition, the CPU 6 of the NIC 2 receiving the notification signal can be configured to include the estimated type of the abnormal operating condition and/or tampering in the message it transmits to the communication station 120 of the utility provider. For example, if the NIC 2 receiving the notification signal newly generates a tampering receipt signal in lieu of relaying the received notification signal, the receiving NIC 2 can be configured to generate a tampering receipt signal to contain the data representative of the estimated type of abnormal operating condition and/or tampering as contained in the notification signal from the abnormal NIC 2.

According to another exemplary embodiment, the abnormality notification signal can indicate that an abnormality exists with the NIC 2, without providing further information as to the purported cause of the abnormality. In either case, upon recognizing receipt of an abnormality notification signal, the neighboring node can prepare and send a notification message to the communication station 120 of the utility provider, either directly or via an access point 110, another neighboring node 130 and/or a relay station 140.

Upon receiving notification at the communication station 120 that a node of the network 100 has been tampered with and/or is operating abnormally, personnel of the utility provider can dispatch a service technician to repair and/or replace the tampered meter and/or defective NIC. In addition, since the tampered meter node transmits the abnormality notification signal at the time that the tampering occurs, inaccurate measurement values and the resultant loss in revenue for the amount of the commodity consumed can be minimized. For example, upon receiving notification of the abnormal operating condition and/or tampering, personnel of the utility provider can initiate an investigation into the cause of the abnormality and respond with appropriate action. Furthermore, since the tamper detection is notified to the communication station 120 contemporaneously with the occurrence and detection of tampering, personnel of the utility provider can, if appropriate, notify appropriate law enforcement authorities at the time the tampering occurred, which can be beneficial to the investigation of the tampering.

In accordance with one or more exemplary embodiments described above, the present disclosure provides a utility meter 130 having an associated NIC 2 that includes a CPU 6 configured to recognize tampering with a respective software component of at least one of the first utility meter 130-1 a second utility meter 130-2 with which the first utility meter 130-2 is configured to communicate over the network 100. For example, the NIC 2 of the first utility meter 130-1 may autonomously detect tampering with a software component of the first utility meter 130-1, autonomously detect tampering with a software component of the second utility meter 130-2 based on a communication with the second utility meter 130-2, and be informed of a tampering with a software component of the second utility meter 130-2 based on a communication received from the second utility meter 130-2 or another node in the network. In accordance with the above-described exemplary embodiments, the CPU 6 includes a notification unit that is configured to output, external to the first utility meter 130-1, notification of the recognized tampering of the first utility meter 130-1 and/or the second utility meter 130-2. The CPU 6 is configured to automatically control the notification unit to output the external notification of the tampering in response to the recognition of the tampering. For example, the CPU 6 can control the transceiver to transmit a notification signal to the second utility meter 130-2, another utility meter 130 in the network 100, the communication station 120 of the utility provider, and/or an access point 110 constituting an interface between the first utility meter 130-1 and the communication station 120 of the utility provider.

In addition, an exemplary embodiment of the present disclosure provides a first utility meter 130 having an associated NIC 2, in which the communication unit (e.g., transceiver 9) is configured to communicate with at least one second utility meter 130-2 arranged in the network 100. The CPU 6 of the first utility meter 130-1 is configured detect a tampering with an operating condition of the second utility meter 130-2 based on a communication transmitted from the second utility meter 130-2 that is indicative of a compromised software component of the second utility meter. For example, the first utility meter 130-1 can autonomously detect, based on its communication with the second utility meter 130-2, that the second utility meter 130-2 is operating with a corrupted or insecure software component, one or more of the security keys of the second utility meter 130-2 has been corrupted, the first utility meter 130-1 receives a number of communications from the second utility meter 130-2 that exceed a threshold value of an expected number of communications for a given time period, and/or the first utility meter 130-1 receives a predetermined number of communications with invalid credentials from the second utility meter 130-2. The CPU 6 of the first utility meter 130-1 can then transmit, external to the first utility meter 130-1, notification of the tampering detected in the second utility meter, automatically in response to detecting the suspected tampering with the operating condition of the second utility meter 130-2. For example, the CPU 6 can control the transceiver to transmit a notification signal to the second utility meter 130-2, another utility meter 130 in the network 100, the communication station 120 of the utility provider, and/or an access point 110 constituting an interface between the first utility meter 130-1 and the communication station 120 of the utility provider.

The foregoing embodiments were described with reference to the structural features of the NIC 2, the associated utility meter and other components in the network 100. The present disclosure is not limited to the exemplary network 100 illustrated in FIG. 1. The exemplary embodiments of the present disclosure can be implemented in any network topology.

The present disclosure also provides a method of operating a NIC to autonomously detect a tampering condition and automatically notify a node in the network, such as a neighboring node and/or the communication station 120, for example. In addition, the present disclosure provides a computer-readable recording medium having a computer program recorded thereon that causes the CPU 6 of a NIC 2 to perform any of the exemplary operations described above. Such a computer-readable recording medium can be embodied, for example, by the memory 7 illustrated in FIG. 1.

Combinations of the above-described exemplary embodiments, and other embodiments not specifically described herein will be apparent to those skilled in the art upon reviewing the above description. The scope of the various exemplary embodiments includes various other applications in which the above systems, structures, programs and methods are used.

It will be appreciated by those skilled in the art that the exemplary embodiments of the present disclosure can be embodied in other specific forms without departing from the spirit or essential character thereof. The presently disclosed embodiments are considered in all respects to be illustrative and not restrictive. The scope of the invention is indicated by the appended claims rather than the foregoing description, and all changes that come within the meaning and range of equivalents thereof are indicated to be embraced therein.

The invention claimed is:

1. A utility network interface device comprising:
a detector configured to produce a state signal upon occurrence of a prescribed state that interferes with the ability of a utility meter, with which the utility network interface device is associated, to at least one of measure consumption of a commodity and report consumption of the commodity;
a control unit configured to detect a tampering with the utility meter in accordance with the state signal produced by the detector; and
a notification unit configured to output, external to the utility meter, notification of the tampering detected by the control unit, wherein:
the control unit is configured to automatically control the notification unit to output the external notification of the tampering in response to the detection of the tampering;
the notification unit includes a transceiver;
the control unit is configured to cause the transceiver to transmit a notification signal containing data representative of the tampering notification and an identification of the utility network interface device wirelessly to a node in a network of which the utility network interface device is a member; and
the node in the network is another utility network interface device with which the utility network interface device is authorized to communicate.

2. The utility network interface device according to claim 1, wherein the node in the network is configured to transmit notification of the identification of the utility network interface device to a communication station of a utility provider, upon receiving the data representative of the tampering notification and the identification of the utility network interface device from the utility network interface device.

3. A utility network interface device comprising:
a detector configured to produce a state signal upon occurrence of a prescribed state that interferes with the ability of a utility meter, with which the utility network interface device is associated, to at least one of measure consumption of a commodity and report consumption of the commodity;
a control unit configured to detect a tampering with the utility meter in accordance with the state signal produced by the detector; and
a notification unit configured to output, external to the utility meter, notification of the tampering detected by the control unit, wherein:
the control unit is configured to automatically control the notification unit to output the external notification of the tampering in response to the detection of the tampering;
the detector comprises a reed switch configured to detect an intensity of a magnetic field of a magnet in proximity to the utility meter with which the utility network interface device is associated; and
the detector is configured to produce the state signal when detecting that the intensity of the magnetic field is below a threshold value.

4. The utility network interface device according to claim 3, wherein:
the notification unit includes a transceiver;
the control unit is configured to cause the transceiver to transmit a notification signal containing data representative of the tampering notification and an identification of the utility network interface device wirelessly to a node in a network of which the utility network interface device is a member; and
the node in the network is one of another utility network interface device with which the utility network interface device is authorized to communicate, and a communication station of a utility provider.

5. A utility network interface device comprising:
a detector configured to produce a state signal upon occurrence of a prescribed state that interferes with the ability of a utility meter, with which the utility network interface device is associated, to at least one of measure consumption of a commodity and report consumption of the commodity;
a control unit configured to detect a tampering with the utility meter in accordance with the state signal produced by the detector; and
a notification unit configured to output, external to the utility meter, notification of the tampering detected by the control unit, wherein:
the control unit is configured to automatically control the notification unit to output the external notification of the tampering in response to the detection of the tampering;
the detector comprises a reed switch configured to detect a presence of a magnetic field having an intensity sufficient to interfere with the ability of the utility meter to at least one of measure consumption of the commodity and report consumption of the commodity; and
the detector is configured to detect the presence of the magnetic field when detecting that the intensity of the magnetic field exceeds a threshold value, and produce the state signal in response to detecting the presence of the magnetic field.

6. The utility network interface device according to claim 5, wherein:
the notification unit includes a transceiver;
the control unit is configured to cause the transceiver to transmit a notification signal containing data representative of the tampering notification and an identification of the utility network interface device wirelessly to a node in a network of which the utility network interface device is a member; and
the node in the network is one of another utility network interface device with which the utility network interface device is authorized to communicate, and a communication station of a utility provider.

7. A utility network interface device comprising:
a detector configured to produce a state signal upon occurrence of a prescribed state that interferes with the ability of a utility meter, with which the utility network interface device is associated, to at least one of measure consumption of a commodity and report consumption of the commodity;
a control unit configured to detect a tampering with the utility meter in accordance with the state signal produced by the detector; and
a notification unit configured to output, external to the utility meter, notification of the tampering detected by the control unit, wherein:
the control unit is configured to automatically control the notification unit to output the external notification of the tampering in response to the detection of the tampering;
the utility network interface device comprises at least one measurement counter configured to measure consumption of the commodity;
the detector comprises a reed switch configured to detect a presence of a magnetic field having an intensity sufficient to interfere with the at least one measurement counter, by detecting whether the intensity of the magnetic field of exceeds a threshold value; and
the detector is configured to transmit the state signal to the control unit in response to detecting that the intensity of the magnetic field is above the threshold value.

8. The utility network interface device according to claim 7, wherein the measurement counter is connected to a measurement device of the utility meter with which the utility network interface device is associated, and is configured to count each unit of consumption of the commodity based on each unit of consumption of the commodity measured by the measurement device.

9. The utility network interface device according to claim 7, wherein:
the notification unit includes a transceiver;
the control unit is configured to cause the transceiver to transmit a notification signal containing data representative of the tampering notification and an identification of the utility network interface device wirelessly to a node in a network of which the utility network interface device is a member; and
the node in the network is one of another utility network interface device with which the utility network interface device is authorized to communicate, and a communication station of a utility provider.

10. A utility network interface device comprising:
a detector configured to produce a state signal upon occurrence of a prescribed state that interferes with the ability of a utility meter, with which the utility network interface device is associated, to at least one of measure consumption of a commodity and report consumption of the commodity;

a control unit configured to detect a tampering with the utility meter in accordance with the state signal produced by the detector;

a notification unit configured to output, external to the utility meter, notification of the tampering detected by the control unit; and a memory unit configured to record therein data respectively representing each instance of tampering detected by the control unit, wherein:

the control unit is configured to automatically control the notification unit to output the external notification of the tampering in response to the detection of the tampering; and the control unit is configured to control the memory unit to record each instance of tampering together with a timestamp indicating when the tampering first occurred, and a duration of the tampering, respectively.

11. The utility network interface device according to claim 10, wherein:

the notification unit includes a transceiver;

the control unit is configured to cause the transceiver to transmit a notification signal containing data representative of the tampering notification and an identification of the utility network interface device wirelessly to a node in a network of which the utility network interface device is a member; and the node in the network is one of another utility network interface device with which the utility network interface device is authorized to communicate, and a communication station of a utility provider.

12. A utility network interface device comprising:

a detector configured to produce a state signal upon occurrence of a prescribed state that interferes with the ability of a utility meter, with which the utility network interface device is associated, to at least one of measure consumption of a commodity and report consumption of the commodity;

a control unit configured to detect a tampering with the utility meter in accordance with the state signal produced by the detector; and a notification unit configured to output, external to the utility meter, notification of the tampering detected by the control unit, wherein:

the control unit is configured to automatically control the notification unit to output the external notification of the tampering in response to the detection of the tampering;

the control unit is configured to detect a tampering with a software component of the utility meter with which the utility network interface device is associated; and the notification unit is configured to output, external to the utility meter, a visual indication constituting the notification of the tampering detected by the control unit.

13. The utility network interface device according to claim 12, wherein the notification unit comprises at least one LED for displaying a representation of the tampering notification according to a predetermined pattern of illuminating the at least one LED.

14. The utility network interface device according to claim 13, wherein the indicator device is configured to illuminate the at least one LED according to a pattern associated with a type of the tampering detected by the control unit.

15. The utility network interface device according to claim 13, wherein:

the control unit is configured to detect a plurality of different types of tampering; and the control unit is configured to control the indicator device to illuminate the at least one LED according to a plurality of unique patterns each being respectively associated with one of the plurality of different types of tampering.

16. The utility network interface device according to claim 15, wherein the types of tampering include (i) a corrupted or insecure software image executed by or to be executed by a processor of the utility network interface device, (ii) a corruption of a security key with which the utility network interface device is enabled to communicate with a node in a network of which the utility network interface device is a member, and (iii) receipt of a predetermined number of communications with invalid credentials from at least one other utility network interface device in the network.

17. The utility network device according to claim 15, further comprising:

a memory unit configured to store prioritization data identifying a predefined order of priority respectively attributed to each one of the plurality of different types of tampering; and the control unit, upon detecting different types of tampering in association with the utility meter, is configured to access the prioritization data stored in the memory unit and prioritize the detected types of tampering according to the prioritization data.

18. The utility network interface device according to claim 17, wherein:

the types of tampering include (i) a corrupted or insecure software image executed by or to be executed by a processor of the utility network interface device, (ii) a corruption of a security key with which the utility network interface device is enabled to communicate with a node in a network of which the utility network interface device is a member, and (iii) receipt of a predetermined number of communications with invalid credentials from at least one other utility network interface device in the network; and the prioritization data stored in the memory unit identifies tampering types (i)-(iii) by an order of priority in which tampering type (i) has the greatest priority and tampering type (iii) has the lowest priority.

19. The utility network device according to claim 17, wherein the control unit is configured to, when detecting the different types of tampering, control the indicator device to successively illuminate the at least one LED according to the unique patterns respectively associated with the detected types of tampering in a sequential order corresponding to the prioritized detected types of tampering.

20. A utility network interface device comprising:

a detector configured to produce a detection signal upon each detection of consumption of a unit of a commodity in a utility meter with which the utility network interface device is associated;

a control unit configured to detect a tampering with the utility meter when a number of detection signals produced by the detector over a predetermined period of time is below a threshold value; and a notification unit configured to output, external to the utility meter, notification of the tampering detected by the control unit, wherein:

the control unit is configured to automatically control the notification unit to output the external notification of the tampering in response to the detection of the tampering;

the notification unit includes a transceiver;

the control unit is configured to cause the transceiver to transmit a notification signal containing data representative of the tampering notification and an identification of the utility network interface device wirelessly to a node in a network of which the utility network interface device is a member; and the node in the network is another utility network interface device with which the utility network interface device is authorized to communicate.

21. The utility network interface device according to claim 20, wherein:

the utility meter includes a disk configured to rotate around an axis of the disk, in an amount proportional to a unit of consumption of a commodity, the rotating disk having a magnet attached to a peripheral portion of the disk;

the detector comprises at least one reed switch configured to detect the presence of the magnet attached to the disk when an intensity of a magnetic field of the magnet exceeds a threshold value, and to produce the detection signal, which represents detection of consumption of the unit of the commodity, each time the detector detects the presence of the magnet.

22. The utility network interface device according to claim 20, comprising a memory unit configured to record therein data representing the threshold value.

23. The utility network interface device according to claim 22, comprising a transceiver configured to receive update threshold data from a node in a network of which the utility network interface device is a member, the update threshold data representing an update to the threshold value data recorded in the memory unit, wherein the control unit is configured to control the memory unit to record therein the update threshold data in place of the threshold value data previously recorded therein.

24. The utility network interface device according to claim 20, wherein the node in the network is configured to transmit notification of the identification of the utility network interface device to a communication station of a utility provider, upon receiving the data representative of the tampering notification and the identification of the utility network interface device from the utility network interface device.

25. A utility network comprising a first utility network interface device and a second utility network interface device, wherein:

the first utility network interface device comprises a first detector configured to produce a state signal upon occurrence of a prescribed state that interferes with the ability of a first utility meter, with which the first utility network interface device is associated, to at least one of measure consumption of a commodity and report consumption of the commodity;

a first control unit configured to detect a tampering with the first utility meter in accordance with the state signal produced by the first detector, and a first notification unit configured to output, external to the first utility meter, notification of the tampering detected by the first control unit to the second utility network interface device;

the first control unit is configured to automatically control the first notification unit to transmit the notification to the second utility network interface device in response to the detection of the tampering;

the second utility network interface device comprises a second notification unit configured to receive the notification from the first notification unit, and a second control unit configured to automatically control the second notification unit to inform a communication station of a utility provider of the receipt of the notification, in response to receipt of the notification from the first notification unit.

26. The utility network according to claim 25, wherein:

the first notification unit includes a first transceiver;

the first control unit is configured to control the first transceiver to wirelessly transmit a notification signal containing data representative of the tampering notification and an identification of the first utility network interface device to the second notification unit;

the second notification unit includes a second transceiver configured to receive the notification signal transmitted wirelessly from the first transceiver of the first notification unit; and the second control unit is configured to control the second transceiver to transmit the notification signal to the communication station of the utility provider.

27. The utility network according to claim 26, wherein the second control unit is configured to control the second transceiver to re-transmit the notification signal to the communication station of the utility provider, when an acknowledgement message is not received by the second transceiver from the communication station of the utility provider within a predetermined period of time from the transmission of the notification signal to the communication station of the utility provider.

28. The utility network according to claim 25, wherein:

the first notification unit includes a first transceiver;

the first control unit is configured to control the first transceiver to wirelessly transmit a notification signal containing data representative of the tampering notification and an identification of the first utility network interface device to the second notification unit;

the second notification unit includes a second transceiver configured to receive the notification signal transmitted wirelessly from the first transceiver of the first notification unit; and the second control unit is configured to generate a tampering receipt signal containing data representative of receipt of the notification signal and the identification of the first utility network interface device, and control the second transceiver to transmit the generated tampering receipt signal to the communication station of the utility provider, in response to receipt of the notification signal from the first notification unit.

29. The utility network according to claim 28, wherein the second control unit is configured to control the second transceiver to re-transmit the tampering receipt signal to the communication station of the utility provider, when an acknowledgement message is not received by the second transceiver from the communication station of the utility provider within a predetermined period of time from the transmission of the tampering receipt signal to the communication station of the utility provider.

30. The utility network according to claim 28, wherein:

the first utility network interface device comprises a memory unit configured to record therein data respectively representative of defined types of tampering detectable by the first control unit;

the first control unit is configured to estimate a type of the detected tampering based on the defined types of tampering recorded in the memory unit, and include data representative of the estimated type of the tampering in the notification signal; and the second control unit is configured to generate the tampering receipt signal to contain the data representative of the estimated type of the tampering as contained in the notification signal received from the first transceiver.

31. The utility network according to claim 30, wherein the types of tampering include types selected from the group consisting of (i) a physical tampering with a component of the first utility network interface device, (ii) a physical tampering with a component of the utility meter to which the first utility network interface device is attached, (iii) a corrupted or insecure software image to be executed or executed by a processor of the first utility network interface device, (iv) a corruption of a security key with which the first utility network interface device is enabled to communicate with a node in a network of which the first utility network interface device is a member, (v) an invalid certificate disabling recognition of the first utility network interface device by a node in the network, and (vi) a tampering with another utility network interface device in the network.

32. The utility network according to claim 25, wherein:
the first detector comprises a reed switch configured to detect an intensity of a magnetic field of a magnet in proximity to the first utility meter with which the first utility network interface device is associated; and
the first detector is configured to produce the state signal in response to detecting that the intensity of the magnetic field is below a threshold value.

33. The utility network according to claim 25, wherein:
the first detector comprises a reed switch configured to detect a presence of a magnet whose magnetic field has an intensity sufficient to interfere with the ability of the first utility meter with which the first utility network interface device is associated to at least one measure consumption of the commodity and report consumption of the commodity; and
the first detector is configured to detect the presence of the magnet when detecting that the intensity of the magnet exceeds a threshold value, and produce the state signal in response to detecting the presence of the magnet.

34. The utility network according to claim 25, wherein:
the first utility network interface device comprises at least one measurement counter configured to measure consumption of a commodity;
the first detector comprises a reed switch configured to detect a presence of a magnetic field having an intensity sufficient to interfere with the at least one measurement counter, by detecting whether the intensity of the magnetic field exceeds a threshold value; and
the first detector is configured to produce the state signal in response to detecting that the intensity of the magnetic field is above the threshold value.

35. The utility network according to claim 25, wherein:
the first control unit is configured to detect a tampering with a software component of the first utility meter with which the first utility network interface device is associated; and
the first notification unit is configured to output, external to the first utility meter, a visual indication constituting the notification of the tampering detected by the first control unit.

36. The utility network according to claim 35, wherein the first utility network interface device comprises an indicator device configured to visually display the tampering notification according to a visual indication pattern associated with the tampering detected by the first control unit.

37. The utility network according to claim 25, wherein:
the first control unit is configured to recognize a tampering with a respective software component of at least one of the first utility meter with which the first utility network interface device is associated, and a second utility meter with which the second utility network interface device is associated; and
the first notification unit is configured to output, external to the first utility meter, notification of the recognized tampering of the at least one of the first utility meter and the second utility meter.

38. The utility network according to claim 37, wherein:
the first notification unit includes a transceiver; and
the first control unit is configured to cause the transceiver to transmit a notification signal to a node in the utility network, when the first control unit recognizes a tampering with a software component of the second utility meter, the notification signal containing data representative of the tampering notification and an identification of the second utility network interface device.

39. The utility network according to claim 38, wherein the node in the network is a device selected from the group consisting of a third utility network interface device which is a member of the network, the communication station of the utility provider, and an access point constituting an interface between the first utility network interface device and the communication station of the utility provider.

40. The utility network according to claim 25, wherein:
the first control unit is configured to detect a tampering with an operating condition of a second utility meter with which the second utility network interface device is associated, based on a communication received from the second utility meter that is indicative of a compromised software component of the second utility network interface device;
the first notification unit includes a transceiver configured to transmit a notification signal, which contains data representative of the detected tampering with the second utility meter and an identification of the second utility meter, to a node in the utility network.

41. The utility network according to claim 40, wherein the node in the network is a device selected from the group consisting of a third utility network interface device which is a member of the network, the communication station of the utility provider, and an access point constituting an interface between the first utility network interface device and the communication station of the utility provider.

42. A computer-readable recording medium having a computer program recorded thereon that causes a computer processing unit of a utility network interface device to perform operations comprising:
producing a state signal upon occurrence of a prescribed state that interferes with the ability of a utility meter, with which the utility network interface device is associated, to at least one of measure consumption of a commodity and report consumption of the commodity;
detecting a tampering with the utility meter in accordance with the state signal produced by the detector; and
automatically outputting, external to the utility meter, notification of the detected tampering in response to the detection of the tampering, wherein:
the utility network interface device comprises a memory unit having record therein tampering type data respectively representing different types of detectable tampering;
the computer program causes the computer processing unit, in response to the detection of tampering, to perform operations comprising:
determining which one of three modes of communication is to be utilized for transmitting the notification of the detected tampering, based on the detected tampering and the tampering type data recorded in the memory unit;

generating a notification signal containing data representative of the tampering notification, an identification of the utility network interface device, and a destination address of at least one node in a utility network of which the utility network interface device is a member, according to one of the three modes of communication, in which in a first mode among the three modes, the destination address is a communication station of a utility provider, in a second mode among the three modes, the destination address is a specific neighboring node of the utility network, and in a third mode among the three nodes, the destination address is any node in the utility network; and automatically transmitting the generated notification signal to the destination address contained in the notification signal.

43. A method of operating a utility network interface device, the method comprising:

producing a state signal upon occurrence of a prescribed state that interferes with the ability of a utility meter, with which the utility network interface device is associated, to at least one of measure consumption of a commodity and report consumption of the commodity;

detecting, in a computer processing unit of the utility network interface device, a tampering with the utility meter in accordance with the state signal produced by the detector;

generating a notification of the detected tampering in the computer processing unit of the utility network interface device; and automatically outputting, external to the utility meter, the generated notification of the detected tampering in response to the detection of the tampering;

accessing a memory unit having record therein tampering type data respectively representing different types of detectable tampering;

determining which one of three modes of communication is to be utilized for transmitting the notification of the detected tampering, based on the detected tampering and the tampering type data recorded in the memory unit;

generating a notification signal containing data representative of the tampering notification, an identification of the utility network interface device, and a destination address of at least one node in a utility network of which the utility network interface device is a member, according to one of the three modes of communication, in which in a first mode among the three modes, the destination address is a communication station of a utility provider, in a second mode among the three modes, the destination address is a specific neighboring node of the utility network, and in a third mode among the three nodes, the destination address is any node in the utility network; and automatically transmitting the generated notification signal to the destination address contained in the notification signal.

* * * * *